(12) United States Patent
Rowlette et al.

(10) Patent No.: US 11,194,143 B2
(45) Date of Patent: *Dec. 7, 2021

(54) LOW-NOISE SPECTROSCOPIC IMAGING SYSTEM USING SUBSTANTIALLY COHERENT ILLUMINATION

(71) Applicant: DAYLIGHT SOLUTIONS, INC., San Diego, CA (US)

(72) Inventors: Jeremy A. Rowlette, Escondido, CA (US); Miles James Weida, Poway, CA (US)

(73) Assignee: DAYLIGHT SOLUTIONS, INC., San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/021,263

(22) Filed: Sep. 15, 2020

(65) Prior Publication Data
US 2020/0409132 A1  Dec. 31, 2020

Related U.S. Application Data

(63) Continuation of application No. 16/581,136, filed on Sep. 24, 2019, now Pat. No. 10,795,139, which is a (Continued)

(51) Int. Cl.
*G02B 21/00* (2006.01)
*G01J 3/28* (2006.01)
(Continued)

(52) U.S. Cl.
CPC ..... *G02B 21/0064* (2013.01); *G02B 21/0032* (2013.01); *G02B 21/0056* (2013.01);
(Continued)

(58) Field of Classification Search
None
See application file for complete search history.

(56) References Cited

U.S. PATENT DOCUMENTS 3,488,118 A    1/1970   Parrent
4,310,852 A    1/1982   Tricoles
(Continued)

FOREIGN PATENT DOCUMENTS

WO   WO2014209471 A2   12/2014
WO   WO2016177897 A1   11/2016

OTHER PUBLICATIONS

European Patent Office Communication pursuant to Article 94(3) EPC, issued in EPO Application Serial No. 15 737 504.9, dated Oct. 1, 2020.
(Continued)

*Primary Examiner* — Tyler W. Sullivan
(74) *Attorney, Agent, or Firm* — Roeder & Broder LLP; Steven G. Roeder

(57) ABSTRACT

A spectral imaging device (12) includes an image sensor (28), a tunable light source (14), an optical assembly (17), and a control system (30). The optical assembly (17) includes a first refractive element (24A) and a second refractive element (24B) that are spaced apart from one another by a first separation distance. The refractive elements (24A) (24B) have an element optical thickness and a Fourier space component of the optical frequency dependent transmittance function. Further, the element optical thickness of each refractive element (24A) (24B) and the first separation distance are set such that the Fourier space components of the optical frequency dependent transmittance function of each refractive element (24A) (24B) fall outside a Fourier space measurement passband.

19 Claims, 10 Drawing Sheets

Related U.S. Application Data continuation of application No. 15/680,019, filed on Aug. 17, 2017, now Pat. No. 10,437,032, which is a continuation of application No. 15/109,570, filed as application No. PCT/US2015/011884 on Jan. 18, 2015, now Pat. No. 9,784,958.

(60) Provisional application No. 61/929,050, filed on Jan. 18, 2014.

(51) Int. Cl.
  *G02B 21/36* (2006.01)
  *G01J 3/12* (2006.01)

(52) U.S. Cl.
  CPC .... *G02B 21/367* (2013.01); *G01J 2003/1226* (2013.01); *G01J 2003/1273* (2013.01); *G01J 2003/2826* (2013.01); *G02B 21/0072* (2013.01)

(56) References Cited

U.S. PATENT DOCUMENTS

| | | |
|---|---|---|
| 6,792,010 B2 | 9/2004 | Koulikov |
| 7,050,215 B1 | 5/2006 | Johnson |
| 7,599,055 B2 | 10/2009 | Gollier et al. |
| 8,534,838 B2 | 9/2013 | Barth et al. |
| 8,598,552 B1 | 12/2013 | Frihauf |
| 9,625,836 B2 | 4/2017 | Yamaguchi |
| 9,823,451 B2 | 11/2017 | Rowlette |
| 2002/0195496 A1 | 12/2002 | Tsikos |
| 2005/0041113 A1 | 2/2005 | Nayar |
| 2005/0201660 A1 | 9/2005 | Grot |
| 2005/0219469 A1 | 10/2005 | Chan |
| 2006/0227316 A1 | 10/2006 | Gatt |
| 2006/0251133 A1 | 11/2006 | Tojo |
| 2007/0187616 A1 | 8/2007 | Burroughs |
| 2008/0018906 A1 | 1/2008 | Kurukawa |
| 2008/0074660 A1 | 3/2008 | Ye |
| 2008/0100510 A1 | 5/2008 | Bonthron |
| 2008/0204760 A1 | 8/2008 | Jacques et al. |
| 2009/0073453 A1 | 3/2009 | Hasegawa |
| 2010/0111122 A1 | 5/2010 | Pusharsky et al. |
| 2010/0185067 A1 | 7/2010 | Gupta |
| 2010/0225924 A1 | 9/2010 | Kuramoto |
| 2011/0051118 A1 | 3/2011 | Sato |
| 2011/0235045 A1 | 9/2011 | Koerner |
| 2011/0292405 A1* | 12/2011 | Dunn ................ G01B 9/02057 356/511 |
| 2012/0046668 A1 | 2/2012 | Gantes |
| 2012/0287418 A1 | 11/2012 | Scherer |
| 2013/0088723 A1 | 4/2013 | Feldkhun |
| 2013/0296710 A1 | 11/2013 | Zuzak et al. |
| 2013/0343632 A1 | 12/2013 | Urano |
| 2014/0253714 A1 | 9/2014 | Weida et al. |
| 2015/0051498 A1 | 2/2015 | Darty |
| 2015/0070756 A1 | 3/2015 | Priest et al. |
| 2015/0168125 A1 | 6/2015 | Arieli |
| 2015/0345906 A1 | 12/2015 | Varshneya |
| 2015/0351722 A1 | 12/2015 | Chen |
| 2016/0018628 A1 | 1/2016 | Rowlette |
| 2016/0209271 A1 | 7/2016 | Rowlette |
| 2017/0031319 A1 | 2/2017 | Bromer |
| 2017/0042428 A1 | 2/2017 | Kellnberger |
| 2017/0343695 A1 | 11/2017 | Stetson |
| 2018/0045926 A1 | 2/2018 | Rowlette |
| 2018/0283946 A1 | 10/2018 | Rowlette |

OTHER PUBLICATIONS

Chow, J et al., "Laser frequency-noise-limited ultrahigh resolution remote fiber sensing", Opt. Express vol. 14, No. 11, May 29, 2006, [online], [retrieved on Mar. 25, 2014]. Retrieved from the Internet: <URL: https://digitalcollections.anu.edu.au/bitstream/10440/381/1/Chow_Laser2006.pdf>; p. 4621.

The International Search Report and Written Opinion of the International Searching Authority for PCT/US2015/011884, Daylight Solutions, Inc., dated Apr. 20, 2015 (related application).

The International Preliminary Report on Patentability issued by the International Bureau on behalf of the International Searching Authority for PCT/US2015/011884, Daylight Solutions, Inc., dated Jul. 19, 2016 (related application).

Extended European Search Report issued by the EPO for application No. 15737504.9, Daylight Solutions, Inc., dated Aug. 8, 2017 (related application).

Francesca Rosi et al., "Noninvasive Analysis of Paintings by Mid-infrared Hyperspectral Imaging", Angewandte Chemie International Edition, vol. 52, No. 20, May 10, 2013 (May 10, 2013), pp. 5258-5261, XP055216492, ISSN: 1433-7851, DOI: 10.1002/anie.201209929 * "Experimental section"; figure 1 *.

Phillips Mark C et al., "Hyperspectral microscopy of explosives particles using an external cavity quantum cascade laser", Optical Engineering, Soc. of Photo-Optical Instrumentation Engineers, Bellingham, vol. 52, No. 6, Jun. 1, 2013 (Jun. 1, 2013), p. 61302, XP060025845, ISSN: 0091-3296, DOI: 10.1117/1.OE.52.6.061302 [retrieved on Dec. 26, 2012] * figure1 ** p. 3, left-hand column*.

Nikodem Michal et al., "Remote mid-infrared sensing using chirped laser dispersion spectroscopy", Advanced Environmental, Chemical, and Biological Sensing Technologies VIII, SPIE, 1000 20th St. Bellingham WA 98225-6705 USA, vol. 8024, No. 1, May 13, 2011 (May 13, 2011), pp. 1-7, XP060016791, DOI: 10.1117/12.883598 [retrieved on Jan. 1, 1901] *Section "Noise performance in CLaDS"*.

Matthew R. Kole et al.: "Discrete Frequency Infrared Microspectroscopy and Imaging with a Tunable Quantum Cascade Laser", Analytical Chemistry, vol. 84, No. 23, Dec. 4, 2012, p. 10366-10372.

Lowenthal S. et al.: "Speckle Removal by a Slowly Moving Diffuser Associated with a Motionless Diffuser", Journal of the Optical Society of America, American Institute of Physics, New York, US, vol. 61, No. 7, Jul. 1, 1971, pp. 847-851.

Frank Fuchs et al.: "Imaging Stand-off Detection of Explosives Using Tunable MIR Quantum Cascade Lasers", Optical Sensing II, vol. 7608, Jan. 23, 2010, p. 760809.

* cited by examiner

Optical Frequency Space

Fourier Space

LOW-NOISE SPECTROSCOPIC IMAGING SYSTEM USING SUBSTANTIALLY COHERENT ILLUMINATION

RELATED APPLICATIONS

This application is a continuation of U.S. application Ser. No. 16/581,136, filed on Sep. 24, 2019, entitled "LOW-NOISE SPECTROSCOPIC IMAGING SYSTEM USING SUBSTANTIALLY COHERENT ILLUMINATION". U.S. application Ser. No. 16/581,136 is a continuation of U.S. application Ser. No. 15/680,019, U.S. patent Ser. No. 10/437,032, filed on Aug. 17, 2017, entitled "LOW-NOISE SPECTROSCOPIC IMAGING SYSTEM USING SUBSTANTIALLY COHERENT ILLUMINATION". U.S. application Ser. No. 15/680,019 is a continuation of U.S. application Ser. No. 15/109,570, U.S. Pat. No. 9,784,958, filed on Jul. 1, 2016, entitled "LOW-NOISE SPECTROSCOPIC IMAGING SYSTEM USING SUBSTANTIALLY COHERENT ILLUMINATION". U.S. application Ser. No. 15/109,570 is a 371 of and claims priority from PCT Application Serial No. PCT/US2015/011884, filed Jan. 18, 2015, entitled "LOW-NOISE SPECTROSCOPIC IMAGING SYSTEM USING SUBSTANTIALLY COHERENT ILLUMINATION". PCT Application Serial No. PCT/US2015/011884 claims priority on U.S. Provisional Application Ser. No. 61/929,050, filed Jan. 18, 2014 and entitled "A LOW-NOISE SPECTROSCOPIC IMAGING SYSTEM USING COHERENT ILLUMINATION". As far as permitted, the contents of U.S. application Ser. No. 16/581,136; U.S. application Ser. No. 15/680,019; U.S. application Ser. No. 15/109,570; PCT Application Serial No. PCT/US2015/011884; and U.S. Provisional Application Ser. No. 61/929,050 are incorporated herein by reference. Further, as far as permitted, the contents of PCT Application Serial No. PCT/US2012/061987 is incorporated herein by reference.

BACKGROUND

Microscopes are often used to analyze a sample in order to evaluate certain details and/or properties of the sample that would not otherwise be visible to the naked eye. Additional information on the chemical properties of the sample can be obtained by illuminating and observing the sample with discrete optical frequencies of monochromatic laser radiation. Samples that can be analyzed this way include human tissue and cells, explosive residues, powders, liquids, solids, polymers, inks, and other materials. A human tissue sample may be analyzed for the presence of cancerous cells and/or other health related conditions. Other materials may be analyzed for the presence of explosive residues and/or other dangerous substances.

Unfortunately, spectral images generated from the samples with existing spectral microscopes can sometimes be of insufficient quality to enable full and effective analysis of the samples. Thus, it is desired to improve the resolution and quality of the spectral images of the samples that are being generated.

SUMMARY

The present invention is directed toward a spectral imaging device for generating a spectral cube of a sample, the spectral imaging device having a desired spectral resolution. The spectral imaging device includes an image sensor, a tunable optical source, an optical assembly, and a control system. The image sensor includes a two-dimensional array of sensors that are used to construct a two-dimensional image. The tunable optical source generates an illumination beam that follows a beam path from the tunable optical source to the sample and from the sample to the image sensor, the illumination beam having a spectral width that is equal to or less than the desired spectral resolution. The optical assembly includes a plurality of refractive elements that are positioned along the beam path between the tunable optical source and the image sensor, the optical assembly including a first refractive element and a second refractive element that are spaced apart from one another by a first separation distance. The control system controls the tunable optical source to generate a plurality of discrete optical frequencies within a desired tuning range, and controls the image sensor to construct a plurality of two-dimensional images.

In one embodiment, the first refractive element has a first element optical thickness and a first Fourier space component of the optical frequency dependent transmittance function, and the second refractive element has a second element optical thickness and a second Fourier space component of the optical frequency dependent transmittance function. Further, the element optical thickness of each refractive element and the first separation distance are set such that the Fourier space components of the optical frequency dependent transmittance function of each refractive element fall outside a measurement passband. As provided herein, the measurement passband is equal to the reciprocal of two times the desired spectral resolution.

In certain embodiments, the element optical thickness, t, for the first and second refractive elements is defined by either $t \geq 1/(2n\Delta v)$ or $t \leq 1/(2n(v_2-v_1))$; and wherein the first separation distance, d, is defined by either $d \geq 1/(2n\Delta v)$ or $d \leq 1/(2n(v_2-v_1))$; where n is refractive index of the respective refractive element, $\Delta v$ is the desired spectral resolution, $v_1$ is a lower bound of the desired tuning range, and $v_2$ is an upper bound of the desired tuning range.

In one embodiment, the control system collects a spectral image with a spectral resolution and optical frequency step size that is less than or equal to the free spectral range of the refractive element having the shortest free spectral range in the beam path divided by two; and a low-pass filter is subsequently applied to the spectral response of each pixel in the spectral image to create an output spectral image at a lower spectral resolution. The control system can apply at least one of a running average and a Gaussian filter. Further, the data can be decimated.

Stated in another fashion, the control system can control the tunable light source to generate a set of discrete optical frequencies near a target optical frequency, with adjacent optical frequencies of the set being spaced apart an optical frequency step, the optical frequency step being sufficiently small such that it does not produce aliasing of the Fourier components of the optical frequency dependent transmittance function of the parasitic etalons contained along the beam path into the measurement passband; and the control system controls the image sensor to construct a separate, two dimensional image at each discrete optical frequency, and the control system constructs an output image of the sample for the target optical frequency using the separate two dimensional images at each discrete optical frequency.

In another embodiment, the control system modulates the tunable light source to generate a set of discrete optical frequencies near a target optical frequency to produce a maximum optical frequency modulation, $\Delta v_{modulation}$, about the target optical frequency which satisfies the following prescription: $\Delta v_{modulation} = \pm \eta \Delta v/2$, where $\eta$ is a constant having a value of greater than or equal to 0.1 and less than or equal to 100, and Δν is the desired optical frequency spectral resolution. Stated in another fashion, the control system modulates the tunable light source to generate a set of discrete optical frequencies about and through a target optical frequency at an optical frequency modulation rate, and wherein the image sensor captures the output image during a capture time that is longer than the inverse of the optical frequency modulation rate.

In certain embodiments, tunable optical source emits a temporally coherent illumination beam and the desired tuning range is the mid-infrared range.

In another embodiment, the present invention is directed to a spectral imaging device for generating a spectral cube of a sample, the spectral imaging device having a desired spectral resolution, the spectral imaging device comprising: an image sensor component that includes a two-dimensional array of sensors that are used to construct a two-dimensional image; a tunable optical source component that generates an illumination beam that follows a beam path from the tunable optical source to the sample and from the sample to the image sensor, the illumination beam having a spectral width that is equal to or less than the desired spectral resolution; an optical assembly including a plurality of refractive element components that are positioned along the beam path between the tunable optical source component and the image sensor component, each refractive element component having an element optical thickness; and a control system that controls the tunable optical source to generate a plurality of discrete optical frequencies within a desired tuning range, and controls the image sensor to construct a plurality of two-dimensional images; wherein the components are spaced apart from one another along the beam path; wherein a separate, separation distance separates adjacent components along the beam path; wherein each element optical thickness is designed to have a Fourier space component of the optical frequency dependent transmittance function that falls outside a measurement passband; wherein each separation distance is designed to have a Fourier space component of the optical frequency dependent transmittance function that falls outside the measurement passband; and wherein the measurement passband is equal to the reciprocal of two times the desired optical frequency spectral resolution.

In still another embodiment, the present invention is directed to a spectral imaging device for generating a spectral cube of a sample, the spectral imaging device having a desired spectral resolution, the spectral imaging device comprising: an image sensor that includes a two-dimensional array of sensors that are used to construct a two-dimensional image; a tunable light source that generates an illumination beam that follows a beam path from the tunable optical source to the sample and from the sample to the image sensor, the illumination beam having a spectral width that is equal to or less than the desired spectral resolution; an optical assembly including a plurality of refractive elements that are positioned along the beam path between the tunable optical source and the image sensor; and a control system that controls the tunable optical source to generate a plurality of discrete optical frequencies within a desired tuning range, and controls the image sensor to construct a plurality of two-dimensional images; wherein the control system collects a spectral image with a spectral resolution and an optical frequency step size that is less than or equal to the free spectral range of the refractive element having the shortest free spectral range in the beam path divided by two; and wherein a low-pass filter is subsequently applied to the spectral response of each pixel in the spectral image to create an output spectral image at a lower spectral resolution.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1A:
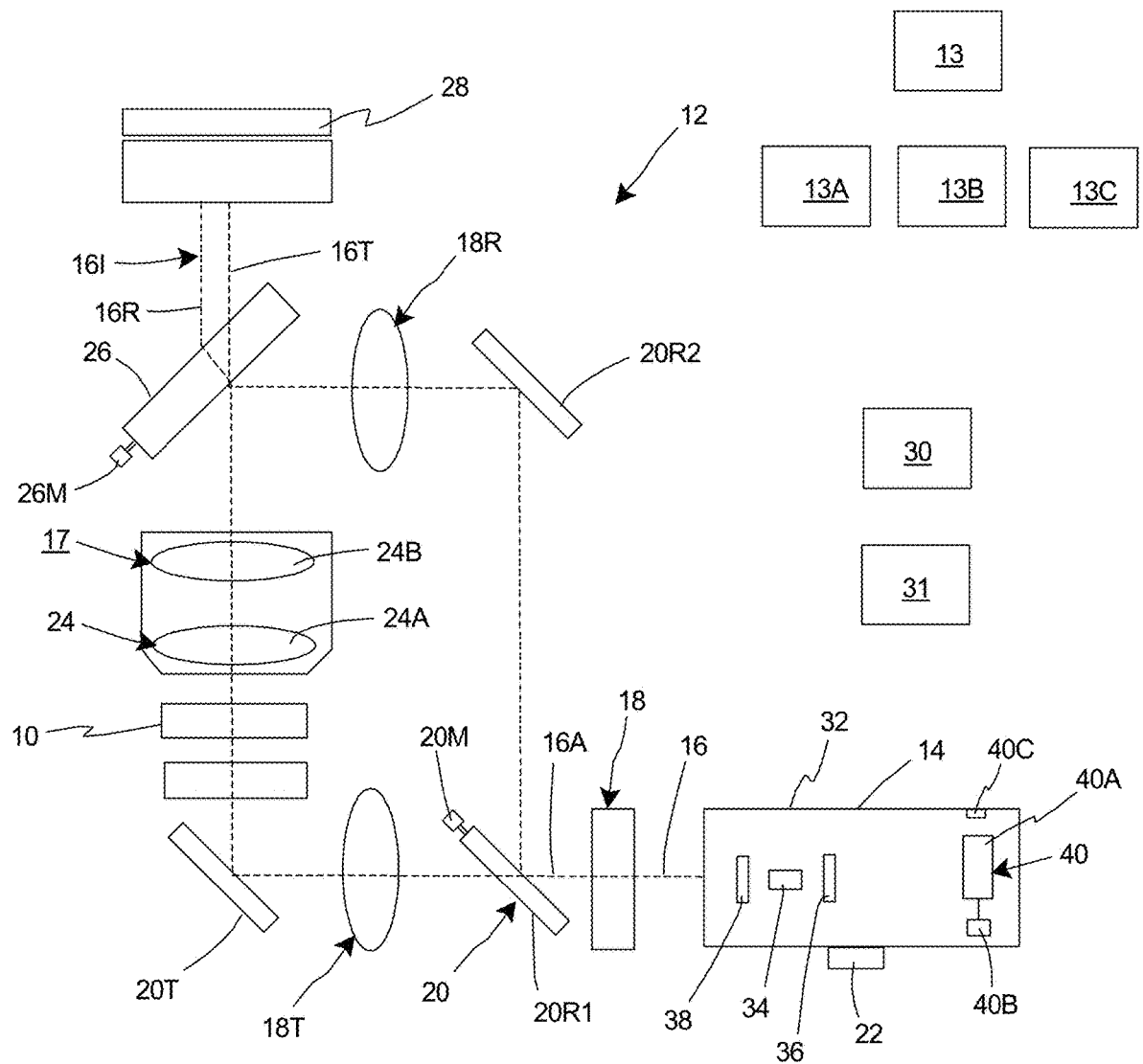
FIG. 1A is a simplified schematic illustration of a sample and an embodiment of a spectral imaging microscope having features of the present invention.

FIG. 1A is a simplified schematic illustration of a sample 10 and an embodiment of a spectral imaging device 12, e.g., a spectral imaging microscope, having features of the present invention. In particular, the spectral imaging device 12 can be used to quickly and accurately acquire a spectral cube 13 (illustrated as a box) of the sample 10 that can be used to analyze and evaluate the various properties of the sample 10. As provided herein, in certain embodiments, the spectral imaging device 12 is uniquely designed to generate a plurality of high resolution, two dimensional, output images 13A, 13B, 13C (only three are illustrated as boxes) of the sample 10 that are used to create the spectral cube 13 for the sample 10. The term "image" as used herein shall mean and include a two-dimensional photograph or screen display, or a two-dimensional array of data that can be used to generate the two-dimensional photograph or screen display.

As an overview, as discussed in greater detail herein below, the spectral imaging device 12 includes a Fourier space measurement pass band (defined by the reciprocal of the spectral resolution and referred to herein simply as a "pass band") and the spectral imaging device 12 can include certain structural features that cause certain noise sources to fall outside the measurement pass band. With this design, the spectral imaging device 12 can effectively inhibit noise sources from adversely impacting the spectral resolution and image quality of each output image 13A, 13B, 13C. Additionally and/or alternatively, the spectral imaging device 12 can utilize algorithms and/or methodologies that further inhibit noise sources from adversely impacting the resolution and image quality of each output image 13A, 13B, 13C.

As provided herein, the sample 10 can be analyzed and evaluated in a static sense, i.e. where the properties of the sample 10 are substantially unchanged over the measurement period, and/or in a dynamic sense, i.e. where the properties of the sample 10 are evolving over the measurement period. In the static case, a one-dimensional spectra is produced for every pixel position of the two-dimensional output image 13A, 13B, 13C to yield a three-dimensional spectral cube 13. In the dynamic case, a fourth dimension of time is added to yield a four-dimensional spectral matrix 13.

The fidelity of the data of the spectral cube 13 can be characterized by the repeatability of the spectral data at each pixel location, over multiple trials. Each trial has a unique data collection start time. Because the source intensity may vary strongly across the sample 10 as well as across the optical frequency band of interest, one or more featureless background spectral cubes (without the sample) may be generated and used to normalize the signal spectral cube by taking the ratio of the signal spectral cube to the background spectral cube. If the frequencies are collected in an ordered array, then the ratio is referred to as the image transmittance.

As provided herein, a ratio of two background spectral cubes taken without the sample 10, at different times, can be used to produce a system transmittance spectral cube (not shown). Comparing the pixel-by-pixel transmittance over many trials and over optical frequencies is a suitable means for characterizing the intrinsic signal-to-noise ratio (SNR) of the spectral imaging device 12. A non-exclusive example of an acceptable measure of the intrinsic system SNR is the reciprocal of the variance of the transmittance over a specified spectral range for two randomly selected spectral cube collection trials taken at different times.

The sample 10 can be a variety of things, including mammalian blood, mammalian blood serum, mammalian cells, mammalian tissue, mammalian biofluids, and their animal counterparts, plant matter, bacteria, polymers, hair, fibers, explosive residues, powders, liquids, solids, inks, and other materials commonly analyzed using spectroscopy and microscopy. More particularly, in certain non-exclusive applications, the sample 10 can be human blood serum, and the spectral imaging microscope 12 can be utilized for rapid screening of the serum sample 10 for the presence of disease and/or other health related conditions; and/or the spectral imaging microscope 12 can be utilized in certain forensic applications such as rapid screening of the sample 10 for the presence of explosive residues and/or other dangerous substances. Additionally, when positioned substantially within the spectral imaging microscope 12 for purposes of analysis, the sample 10 can be present by itself, or the sample 10 can be held in place using one or more slides (not shown), e.g., infrared transparent slides.

Further, the sample 10 can be thin enough to allow study through transmission of an illumination beam, e.g., an infrared illumination beam, through the sample 10 (i.e. in transmission mode), or the sample 10 can be an optically opaque sample that is analyzed through reflection of an illumination beam, e.g., an infrared illumination beam, by the sample 10 (i.e. in reflection mode). Still further, the sample 10 can be thin enough to allow study through transflection of an illumination beam, e.g., an infrared illumination beam can pass through the sample, reflect on the surface of a reflective substrate, and again pass through the sample 10, the illumination beam being double attenuated. For example, in the embodiment illustrated in FIG. 1A, the spectral imaging microscope 12 can be utilized in transmission mode and/or reflection mode, and data can be acquired using a transmission, reflection, or transflection methodology.

It should be appreciated that the spectral imaging device 12 can be utilized in a variety of potential applications. For example, such applications can include, but are not limited to, spectral histopathology and cytopathology, hematology, pharmaceutical drug development and process control, detection of biochemical warfare agents and other hazardous materials, materials science, and polymer science development.

The design of components of the spectral imaging device 12 can be varied to achieve the desired characteristics of the spectral imaging device 12. In one embodiment, the spectral imaging device 12 is an infrared spectral imaging microscope that uses tunable laser radiation to interrogate the sample 10.

In the non-exclusive embodiment illustrated in FIG. 1A, the spectral imaging microscope 12 includes (i) a tunable optical source 14 that generates and/or emits an optical illumination beam 16, (ii) an optical assembly 17 that includes an illumination optical assembly 18 and an imaging optical assembly 24, (iii) a beam steerer assembly 20 that steers the illumination beam 16 along a desired beam path, (iv) an illumination switch 22 that is controlled by a user (not shown) so that the illumination beam 16 can be alternatively directed at the sample 10 in a transmission mode or a reflection mode, (v) a beam splitter 26, (vi) an image sensor 28 that captures information to create the output images 13A, 13B, 13C and the spectral cube 13 of the sample 10; and (vii) a control system 30 that is electrically connected to and controls many of the components of the spectral imaging device 12. One or more of these devices can be referred to as a component.

It should be noted that the spectral imaging microscope 12 can be designed with more or fewer components than are illustrated in FIG. 1A, and/or the components can be organized in another fashion than illustrated in FIG. 1A. For example, the spectral imaging microscope 12 can include a multiple position lens turret (not shown) that includes one or more mid-infrared objective lens assemblies with different characteristics, and/or one or more objective lens assemblies that work outside the mid-infrared spectral range. Additionally, for example, the optical assembly 17 can be designed without the illumination optical assembly 18.

Moreover, the spectral imaging device 12 can include an image display 31 (illustrated as a box), e.g. an LED display, that displays one or more of the output images 13A, 13B, 13C in real time, and/or subsequently displays the spectral cube 13.

In certain embodiments, the spectral imaging microscope 12 has a relatively high resolution, high numerical aperture ("NA"), and a relatively large field of view ("FOV"). This allows for the collection of data from relatively large samples. This will improve the speed in which the sample is analyzed. As one non-exclusive example, the spectral imaging microscope 12 can have NA of 0.7, a magnification of 12.5×, and a FOV of approximately 650 μm×650 μm, with a sample-referred pixel size of 1.36 μm.

In certain embodiments, the tunable optical source 14 includes a laser source that emits a substantially temporally coherent illumination beam 16 (e.g. a laser beam) that is usable for illuminating and analyzing the sample 10 in transmission mode and/or in reflection mode. The illumination beam 16 is made up of a plurality of illumination rays 16A that follow a beam path from the optical source 14 to the sample 10 and from the sample 10 to the image sensor 28. Further, the illumination rays 16A can have a single, discrete center optical frequency that is within a desired tuning range of the optical source 14. Alternatively, the optical source 14 can be controlled by the control system 30 to vary the discrete center optical frequency of the illumination rays 16A over time within the desired tuning range.

In certain embodiments, the optical illumination beam 16 has a spectral width that is equal to or less than a desired spectral resolution (represented by the delta v "Δv") of the spectral imaging device 12. The builder of the spectral imaging device 12 selects the desired spectral resolution and builds the system accordingly. For example, the desired spectral resolution of the spectral imaging device 12 can be four $cm^{-1}$ wavenumbers ($\Delta v=4$ $cm^{-1}$). Alternatively, for example, the desired spectral resolution can be 2, 3, 4, 4.1, 5, 5.25, 6, 7, 8, 9, 10, or 16 $cm^{-1}$ wavenumbers. However, other desired spectral resolutions can be utilized.

In certain non-exclusive embodiments, the tunable optical source 14 is a tunable mid-infrared optical source that directly generates and emits the illumination beam 16 having a center optical frequency that is in the mid-infrared ("MIR") range. In this example, the desired tuning range is the MIR range. Further, as used herein, term "MIR range" shall mean and include the spectral region or spectral band of between approximately two and twenty micrometers (2-20 μm) in wavelength or five thousand to 500 wavenumbers (5000-500 $cm^{-1}$). The mid-infrared range is particularly useful to spectroscopically interrogate the sample 10 since many samples 10 are comprised of molecules or groups of molecules that have fundamental vibrational modes in the MIR range, and thus present strong, unique absorption signatures within the MIR range. Alternatively, the tunable optical source 14 can be designed to generate the illumination beam 16 having a center optical frequency of greater than twenty or less than two micrometers.

Moreover, in alternative embodiments, the tunable optical source 14 can be either a pulsed laser or a continuous wave (CW) laser. For a pulsed optical source 14, the illumination beam 16 will include a plurality of pulses of illumination rays 16A that follow the beam path from the tunable optical source 14 to the sample 10 and from the sample 10 to the image sensor 28. Further, the pulses of illumination rays 16A can have a discrete center optical frequency that is within the MIR range.

In certain embodiments, the discrete center optical frequency of the optical illumination source 16A can vary over time over the entire or a portion of the MIR range to analyze the sample 10 over the desired spectral range. For example, for a pulsed optical source 14, the optical source 14 can be tuned to generate an optical illumination beam 16 that consists of a set of sequential, specific output pulses of light having different, discrete center optical frequency that span the entire or just a portion of the MIR range. For example, the optical source 14 can be tuned to a first position and one or more pulses can be generated having approximately the same first center optical frequency ("first target optical frequency"). Subsequently, the optical source 14 can be tuned to a second position and one or more pulses can be generated having approximately the same second center optical frequency ("second target optical frequency") that is different from the first center optical frequency. Next, the optical source 14 can be tuned to a third position and one or more pulses can be generated having approximately the same third center optical frequency ("third target optical frequency") that is different from the first and second center optical frequency. This process can be repeated to a plurality of additional target optical frequencies throughout a portion or the entire MIR range. As non-exclusive examples, the number of pulses at each discrete optical frequency can be 1, 5, 10, 50, 100, 200, 500, 1000, 10,000 or more. Alternatively, the tunable optical source 14 can be operated in a continuous wave fashion at each target optical frequency.

The number of discrete target optical frequencies in the set used to acquire the spectral cube 13 can also vary according to the sample 10. As non-exclusive examples, the number of discrete target optical frequencies in the mid-infrared range utilized to acquire the spectral cube 13 can be approximately 1, 2, 3, 4, 5, 6, 7, 8, 9, 10, 15, 20, 25, 40, 200, 226, 400, 552 or 4000. As provided herein, the term "target optical frequency step" shall mean the smallest allowed difference between adjacent target optical frequencies. In alternative, non-exclusive embodiments, the target optical frequency step can be approximately 0.1, 0.2, 0.25, 0.33, 0.5, 0.67, 0.7, 1.0, 2.0, 4.0, 8.0, or 16, wavenumbers.

In certain, non-exclusive embodiments, the illumination beam 16 from the MIR optical source 14 has an optical spectral full width at half maximum (FWHM) of less than approximately 0.01, 0.05, 0.1, 0.25, 0.5, 1.0, 2.0, or 4 $cm^{-1}$.

In certain embodiments, the control system 30 can control the optical source 14 to be tuned so that the illumination beam 16 has the first target optical frequency, and the control system 30 can control the image sensor 28 to capture the first image 13A with the sample 10 illuminated at the first target optical frequency. Subsequently, the control system 30 can control the optical source 14 to be tuned so that the illumination beam 16 has the second target optical frequency and the control system 30 can control the image sensor 28 to capture the second image 13B with the sample 10 illuminated at the second target optical frequency. This process is repeated for each target optical frequency until a plurality of images 13A, 13B, 13C, are collected across the optical frequency range of interest, thus generating a spectral cube 13.

Additionally, the optical source 14 of FIG. 1A can include multiple individual lasers that span a portion or all of the desired mid-infrared spectral range. A description of a optical source 14 that includes multiple individual lasers is described in U.S. patent application Ser. No. 13/949,159, entitled "Laser Source With A Large Spectral Range" filed on Jul. 23, 2013. As far as permitted, the contents of U.S. patent application Ser. No. 13/949,159 are incorporated herein by reference. The optical source 14 can utilize a variety of methods to rapidly switch between the target optical frequencies. These include techniques such as rapid tuning mechanisms, galvo-controllled mirrors to switch between different laser modules, or spectral beam combining techniques of multiple laser modules and subsequent time-division multiplexing of laser illumination.

In one, non-exclusive embodiment, the optical source 14 is an external cavity laser that includes a rigid laser frame 32, a gain medium 34, a cavity optical assembly 36, an output optical assembly 38, and a wavelength selective ("WS") feedback assembly 40 (e.g., a movable grating).

The design of the gain medium 34 can be varied pursuant to the teachings provided herein. In one, non-exclusive embodiment, the gain medium 34 directly emits the illumination beam 16 without any frequency conversion. As a non-exclusive example, the gain medium 34 can be a semiconductor type laser. As used herein, the term semiconductor shall include any solid crystalline substance having electrical conductivity greater than insulators but less than good conductors. More specifically, in certain embodiments, the gain medium 34 is a Quantum Cascade (QC) gain medium, an Interband Cascade (IC) gain medium, or a mid-infrared diode. Alternatively, another type of gain medium 34 can be utilized.

In FIG. 1A, the gain medium 34 includes (i) a first facet that faces the cavity optical assembly 36 and the WS feedback assembly 40, and (ii) a second facet that faces the output optical assembly 38. In this embodiment, the gain medium 34 emits from both facets. In one embodiment, the first facet is coated with an anti-reflection ("AR") coating and the second facet is coated with a reflective coating. The AR coating allows light directed from the gain medium 34 at the first facet to easily exit the gain medium 34 as an illumination beam directed at the WS feedback assembly 40; and allows the illumination beam reflected from the WS feedback assembly 40 to easily enter the gain medium 34.

The illumination beam 16 exits from the second facet. The reflective coating on the second facet reflects at least some of the light that is directed at the second facet from the gain medium 34 back into the gain medium 34. In one non-exclusive embodiment, the AR coating can have a reflectivity of less than approximately 2 percent, and the reflective coating can have a reflectivity of between approximately 2-95 percent. In this embodiment, the reflective coating acts as an output coupler (e.g., a first end) for the external cavity.

The cavity optical assembly 36 is positioned between the gain medium 34 and the WS feedback assembly 40 along a lasing axis, and collimates and focuses the light that passes between these components. For example, the cavity optical assembly 36 can include a single lens or more than one lens. For example, the lens can be an aspherical lens having an optical axis that is aligned with the lasing axis. In one embodiment, to achieve the desired small size and portability, the lens has a relatively small diameter. The lens can comprise materials selected from the group of Ge, ZnSe, ZnS, Si, CaF2, BaF2 or chalcogenide glass. However, other materials may also be utilized.

The output optical assembly 38 is positioned along the lasing axis. In this design, the output optical assembly 38 collimates and focuses the illumination beam 16 that exits the second facet of the gain medium 34. For example, the output optical assembly 38 can include a single lens or more than one lens that are somewhat similar in design to the lens of the cavity optical assembly 36.

The WS feedback assembly 40 reflects the light back to the gain medium 34, and is used to precisely select and adjust the lasing frequency (wavelength) of the external cavity and the center optical frequency of the illumination beam 16. Stated in another fashion, the WS feedback assembly 40 is used to feed back to the gain medium 34 a relatively narrow band optical frequency which is then amplified in the gain medium 34. In this manner, the illumination beam 16 may be tuned with the WS feedback assembly 40 without adjusting the gain medium 34. Thus, with the external cavity arrangements disclosed herein, the WS feedback assembly 40 dictates what optical frequency will experience the most gain and thus dominate the optical frequency of the illumination beam 16.

A number of alternative embodiments of the WS feedback assembly 40 can be utilized. In FIG. 1A, the WS feedback assembly 40 is spaced apart from the gain medium 34 and defines a second end of the external cavity. In this embodiment, the external cavity extends from the output coupler (reflective coating) on the second facet to the WS feedback assembly 40. The term external cavity is utilized to designate the WS feedback assembly 40 is positioned outside of the gain medium 34.

In some embodiments, the WS feedback assembly 40 includes a diffraction grating 40A and a grating mover 40B that selectively moves (e.g., rotates) the diffraction grating 40A to adjust the lasing frequency of the gain medium 34 and the optical frequency of the illumination beam 16. The diffraction grating 40A can be continuously monitored with an encoder 40C that provides for closed loop control of the grating mover 40B. With this design, the optical frequency of the illumination beam 16 can be selectively adjusted in a closed loop fashion so that the sample 10 can be imaged at many different, precise, selectively adjustable optical frequencies throughout a portion or the entire MIR spectrum.

The control system 30 controls the operation of the tunable optical source 14 including the electrical power to the grating mover 40B, and the electrical power that is directed to the gain medium 34 (e.g., controls the gain medium 34 by controlling the electron injection current). Further, the control system 30 can control the image sensor 28 to control the timing of the capture of the images 13A, 13B, 13C. For example, the control system 30 can include one or more processors and/or storage devices.

The collection of an accurate spectral cube 13 requires that the optical frequency of the optical illumination beam be precisely known as the laser is tuned. In certain embodiments, the control system 30 directs the pulses of power to the gain medium 34 based on the position signal received from the encoder 40C. Stated in another fashion, the control system 30 can direct one or more pulses of power to the gain medium 34 at each of the plurality of alternative device positions so that the laser generates the set of discrete target optical frequencies. In this embodiment, the control system 30 can direct one or more pulses of power to the gain medium 34 upon receipt of each new position signal. As a result thereof, the specific optical frequency of the pulses will not be influenced by variations in speed of the grating mover 40B.

The duration of each pulse of power directed by the control system 30 to the gain medium 34 can also be varied. In alternative, non-exclusive embodiments, the control system 30 can control each pulse of power to have a duration of approximately 10, 25, 50, 75, 100, 150, 200, 300, 400, 500, 600 or 700 nanoseconds.

Figure 1B:
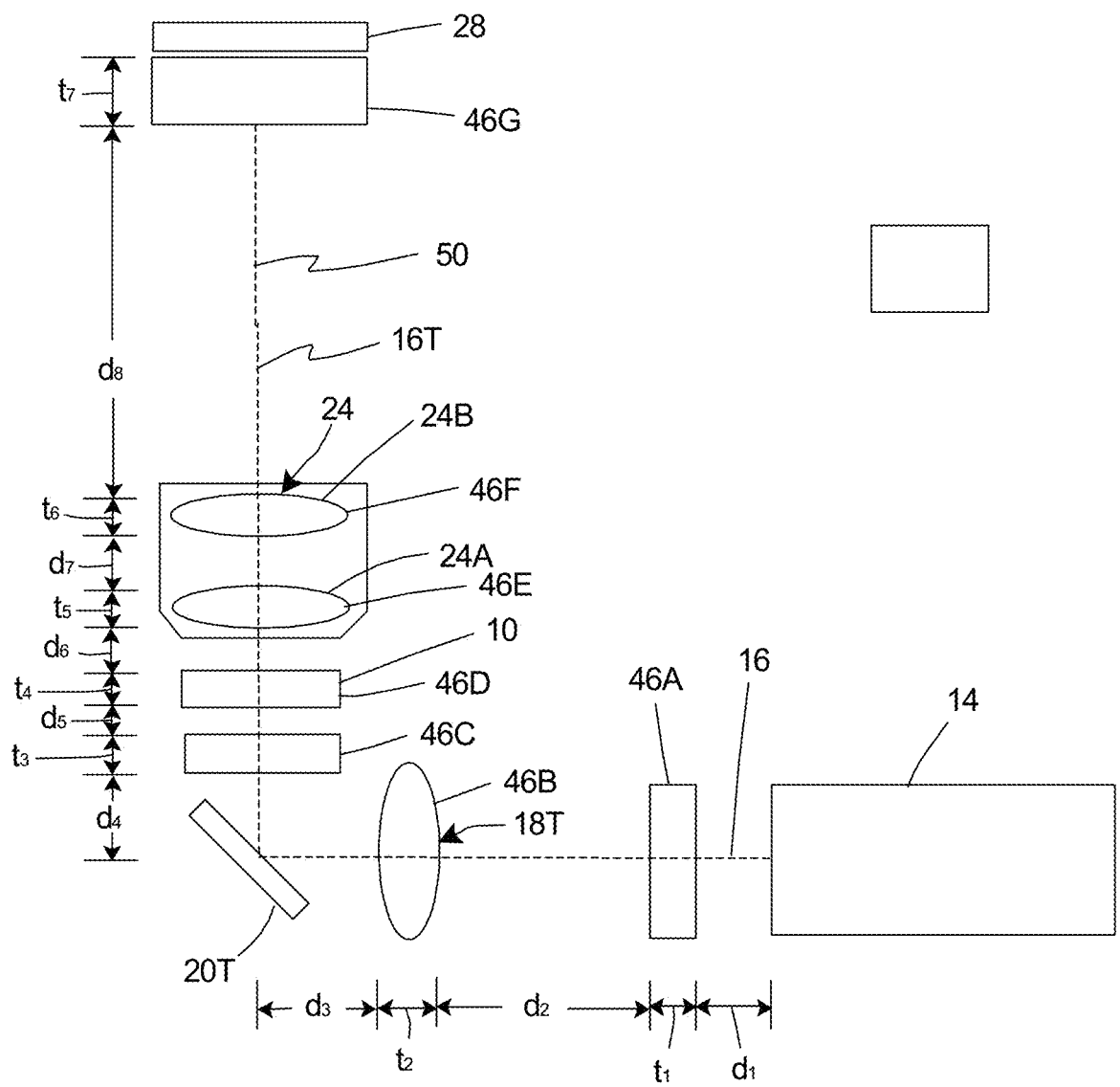
FIG. 1B is a simplified schematic illustration of the spectral imaging microscope of FIG. 1A, in a transmission mode.

Once the tunable optical source 14 has emitted the illumination beam 16, the illumination beam 16 is directed toward the sample 10 so that the sample 10 may be properly and effectively illuminated by the illumination beam 16. For example, when the spectral imaging microscope 12 is operating in transmission mode, the illumination beam 16 is directed toward the sample 10 in order to properly and effectively illuminate the sample 10. In this example, the illumination rays 16A that are transmitted through the sample 10 are referred to as transmitted rays 16T (also illustrated more clearly in FIG. 1B). As will be discussed in further detail herein below, FIG. 1B is a simplified schematic illustration of a transmission beam path of the illumination beam 16 from the optical source 14 of the spectral imaging microscope 12 of FIG. 1A to the image sensor 28, with the sample 10 being interrogated via transmission of the illumination beam 16 through the sample 10.

Figure 1C:
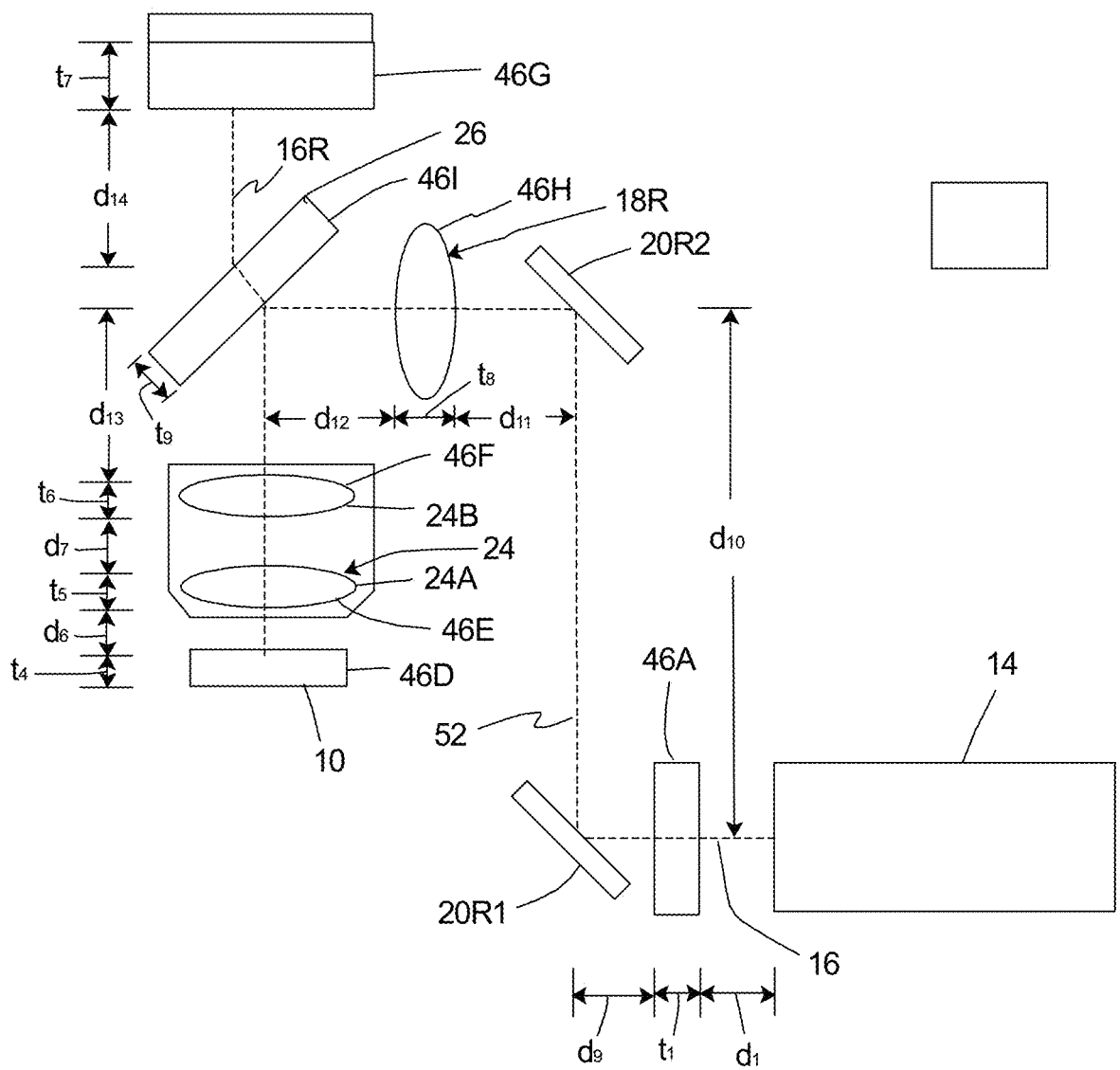
FIG. 1C is a simplified schematic illustration of the spectral imaging microscope of FIG. 1A, in a reflection mode.

In another example, when the spectral imaging microscope 12 is operating in reflection mode, the illumination beam 16 is directed toward the sample 10 in order to properly and effectively illuminate the sample 10. In this example, the illumination rays 16A that are reflected off of the sample 10 are referred to as reflected rays 16R (also illustrated more clearly in FIG. 1C). As will be discussed in further detail herein below, FIG. 1C is a simplified schematic illustration of an alternative reflection beam path of the illumination beam 16 from the tunable optical source 14 of the spectral imaging microscope 12 of FIG. 1A to the image sensor 28, with the sample 10 being interrogated via reflection of the illumination beam 16 off of the sample 10.

In the embodiment illustrated in FIG. 1A, when operating in transmission mode, the illumination beam 16 exiting the tunable optical source 14 is directed with a portion of the illumination optical assembly 18, i.e. a transmission illumination optical assembly 18T (illustrated more clearly in FIG. 1B), toward the sample 10 so as to impinge on the sample 10. In one embodiment, the transmission illumination optical assembly 18T can include one or more optical, refractive elements, e.g., lenses and/or windows (three such refractive elements are illustrated in FIG. 1A), that direct the illumination beam 16 at the sample 10. Further, in certain embodiments, the refractive elements are operable in the MIR range. Moreover, as described in greater detail herein below, pursuant to the teachings of the present invention, the refractive elements can have thicknesses and spacing (i.e. separation) that inhibit wavelength-dependent noise, e.g., parasitic etalon modulations, from adversely impacting the image quality and optical spectral resolution of the spectra generated from the set of wavelength dependent spectral images 13A, 13B, 13C of the sample 10 that are being generated.

It should be appreciated that the fluid, e.g., air or another suitable fluid, that fills the spacing between the optical elements of the transmission optical assembly 18T also functions as optical elements that can be refractive in the MIR range.

In certain embodiments, the transmission illumination optical assembly 18T can be used to transform, i.e. to increase (magnify) or decrease, the size and profile of the illumination beam 16 to match and simultaneously illuminate a desired transmission illuminated area on the sample 10. Stated another way, the transmission illumination optical assembly 18T can be used to condition and focus the illumination beam 16 so that the illumination beam 16 has the correct or desired size and beam profile on the sample 10. In certain embodiments, the size of the transmission illuminated area of the sample 10 is tailored to correspond to the design of the image sensor 28 and the imaging optical assembly 24. As non-exclusive examples, the desired transmission illuminated circular area bounded by a diameter that is approximately 50, 100, 200, 250, 500, 600, 650, 700, 1000, or by 2000 um.

In the embodiment illustrated in FIG. 1A, the spectral imaging microscope 12 and/or the illumination optical assembly 18 can also include a reflection illumination optical assembly 18R (illustrated more clearly in FIG. 1C) for directing the illumination beam 16 at the sample 10 when operating in reflection mode. In one embodiment, the reflection illumination optical assembly 18R includes one or more optical, refractive elements, e.g., lenses and/or windows that direct the illumination beam 16 at the sample 10. In this embodiment, the refractive elements can be operable in the MIR range. Moreover, as described in greater detail herein below, pursuant to the teachings of the present invention, the refractive elements can have thicknesses and spacing (i.e. separation) that inhibit wavelength-dependent noise, e.g., parasitic etalon modulations, from adversely impacting the image quality and optical spectral resolution of the spectra generated from the set of wavelength dependent spectral images 13A, 13B, 13C of the sample 10 that are being generated.

Additionally, in certain embodiments, the reflection illumination optical assembly 18R can be used to transform, i.e. to increase (magnify) or decrease, the size and profile of the illumination beam 16 to match a desired reflection illuminated area on the sample 10. Stated another way, the reflection illumination optical assembly 18R can be used to condition and focus the illumination beam 16 so that the illumination beam 16 has the desired beam profile on the sample 10. As non-exclusive examples, the desired reflection illuminated area is approximately a circular area bounded by a diameter that is approximately 50, 100, 200, 250, 500, 600, 650, 700, 1000, or by 2000 um.

As noted above, the beam steerer assembly 20 is utilized to steer the illumination beam 16 such that the illumination beam 16 can be alternatively utilized in transmission mode or reflection mode. The design of the beam steerer assembly 20 can be varied. In one embodiment, the beam steerer assembly 20 includes a plurality of beam steerers 20T, 20R1, 20R2, e.g. mirrors (reflective in the desired optical frequency spectrum), which are positioned so as to redirect the path of the illumination beam 16 by approximately ninety degrees. Alternatively, the beam steerer assembly 20 can have a different design and/or the beam steerers 20T, 20R1, 20R2 can be positioned so as to redirect the path of the illumination beam 16 by greater than or less than approximately ninety degrees. Still alternatively, the beam steerers 20T, 20R1, 20R2 can include a curved mirror that conditions the illumination beam 16 (i) to complement the illumination optical assembly 18, or (ii) to allow for the elimination of a portion or all of the illumination optical assembly 18. Furthermore, the beam steerer assembly may also include one or more electrically controllable angular adjustments.

For example, in the embodiment illustrated in FIG. 1A, when utilized in transmission mode, the illumination beam 16 only impinges on a single transmission beam steerer 20T before being directed toward the sample 10. Additionally and/or alternatively, in this embodiment, when utilized in reflection mode, the illumination beam impinges on two reflection beam steerers, i.e. a first reflection beam steerer 20R1 and a second reflection beam steerer 20R2, before being directed toward the sample 10.

It should be appreciated that, in this embodiment, the first reflection beam steerer 20R1, which is positioned between the optical source 14 and the transmission beam steerer 20T, includes a steerer mover 20M that can be controlled to selectively move the first reflection beam steerer 20R1 out of the way of the illumination beam 16. With such design, when the spectral imaging device 12 is being used in transmission mode, the first reflection beam steerer 20R1 can be selectively moved out of the beam path so that the illumination beam 16 does not impinge on the first reflection beam steerer 20R1.

The illumination switch 22 enables the spectral imaging microscope 12 to selectively switch between transmission mode and reflection mode. In particular, in this embodiment, the illumination switch 22 can be utilized to selectively activate the steerer mover 20M to move the first reflection beam steerer 20R1 out of the path of the illumination beam 16, i.e. when the spectral imaging microscope 12 is being utilized in transmission mode; or to move the first reflection beam steerer 20R1 into the path of the illumination beam 16, i.e. when the spectral imaging microscope 12 is being utilized in reflection mode.

Moreover, in reflection mode, as illustrated in FIG. 1A, the illumination beam 16 is directed at the sample 10 with the beam splitter 26. The design of the beam splitter 26 can be varied to suit the specific requirements of the spectral imaging microscope 12. In certain embodiments, the beam splitter 26, e.g., a fifty percent (50%) beam splitter, can redirect a first portion of the illumination beam 16 toward the sample 10, and transmit a second portion (not shown) of the illumination rays 16A of the illumination beam 16. The second portion of the illumination beam 16 is subsequently directed away from the system and not used by the spectral imaging microscope 12. It should be noted that the second (or discarded) portion of the illumination beam 16 that is generated from this first pass through the beam splitter 26 is not shown in FIG. 1A for purposes of clarity.

In certain embodiments, the beam splitter 26 can be made from a variety of infrared transmissive materials, such as ZnSe or Ge, or other materials. Additionally, the beam splitter 26 can be a plano-plano beam splitter, with one side anti-reflection (AR) coated, and the other coated or uncoated for partial reflectivity. The beam splitter 26 can also provide lensing action for transforming the illumination beam 16 as desired. The beam splitter 26 can also incorporate design elements to eliminate first and second surface interference effects due to the coherent nature of the illumination beam 16. As non-exclusive examples, design elements that would reduce the surface interference effects include anti-reflective coatings (for the optical frequency of the beam), wedged elements, and/or curved optical surfaces.

The imaging optical assembly 24 can have any suitable design depending on the specific requirements of the spectral imaging microscope 12. When the illumination rays 16A of the illumination beam 16 are illuminating the sample 10 in transmission mode, at least a portion of the transmitted rays 16T that are transmitted through the sample 10 are received by the imaging optical assembly 24 and imaged on the image sensor 28. Somewhat similarly, when the illumination rays 16A of the illumination beam 16 are illuminating the sample 10 in reflection mode, at least a portion of the reflected rays 16R that are reflected from the sample 10 are received by the imaging optical assembly 24 and imaged on the image sensor 28. Stated in another fashion, the imaging optical assembly 24 receives at least a portion of the transmitted rays 16T that are transmitted through the sample 10, or at least a portion of the reflected rays 16R that are reflected from the sample 10 and forms an image on the image sensor 28.

As utilized herein, the term "imaged rays" 16I shall mean the transmitted rays 16T or the reflected rays 16R that are collected by the imaging optical assembly 24 and imaged on the image sensor 28. As provided herein, the imaging optical assembly 24 receives the imaged rays 16I from a plurality of points on the sample 10 and forms the image on the image sensor 28.

In one embodiment, the imaging optical assembly 24 can include a first refractive element 24A and a second refractive element 24B that cooperate to form an image of the sample 10 on the image sensor 28. Alternatively, the imaging optical assembly 24 can include greater than two refractive elements or only one refractive element.

In one embodiment, the first refractive element 24A can be an objective lens that collects the imaged rays 16I, and focuses the imaged rays 16I on the image sensor 28. Moreover, as illustrated, the first refractive element 24A is positioned substantially between the sample 10 and the second refractive element 24B. Additionally, in one embodiment, the second refractive element 24B can be a projection lens that projects the imaged rays 16I toward the image sensor 28. Moreover, as illustrated, the second refractive element 24B is positioned substantially between the first refractive element 24A and the image sensor 28. Further, in certain embodiments, each of the refractive elements 24A, 24B can be refractive in the MIR range and/or the optical frequency of the illumination beam 16. Still further, one or both of the refractive elements 24A, 24B can be a compound lens. Moreover, as described in greater detail herein below, pursuant to the teachings of the present invention, the refractive elements 24A, 24B can have thicknesses and spacing (i.e. separation) that inhibit wavelength-dependent noise, e.g., parasitic etalon modulations, from adversely impacting the image quality and optical spectral resolution of the spectra generated from the set of wavelength dependent spectral images 13A, 13B, 13C of the sample 10 that are being generated.

In one embodiment, each refractive element in the spectral imaging device 12 has an element optical thickness, t, that is defined by either $t \geq 1/(2n\Delta v)$ or $t \leq 1/(2n(v_2-v_1))$; and the spacing (separation distance, d) between adjacent refractive elements is defined by either $d \geq 1/(2n\Delta v)$ or $d \leq 1/(2n(v_2-v_1))$; where n is refractive index of the respective refractive element, $\Delta v$ is the desired spectral resolution, $v_1$ is a lower bound of the desired tuning range, and $v_2$ is an upper bound of the desired tuning range. Alternatively, each refractive element is defined by both $t \geq 1/(2n\Delta v)$ or $t \leq 1/(2n(v_2-v_1))$; and the spacing (separation distance, d) is defined by both $d \geq 1/(2n\Delta v)$ or $d \leq 1/(2n(v_2-v_1))$.

It should be appreciated that the fluid, e.g., air or another suitable fluid that fills the spacing between the refractive elements 24A, 24B, and the spacing between the refractive elements 24A, 24B and the image sensor 28 also function as optical elements that can be refractive in the MIR range.

Each of the refractive elements 24A, 24B in the spectral imaging device 12 is operative in the desired tuning range of the spectral imaging device 12 and can be types such as plano-convex, plano-concave, meniscus, and aspherical, as well as other types. For refractive lenses in the MIR range, materials such as Ge, ZnSe, ZnS, Si, CaF, BaF or chalcogenide glass and other materials can be employed. Reflective lenses can be elliptical, paraboloid, or other shapes. The reflective surface can be dichroic coating, Au, Ag, or other surface types.

Further, as shown in the embodiment illustrated in FIG. 1A, the imaged rays 16I, i.e. the transmitted rays 16T or the reflected rays 16R, that are collected and focused by the first refractive element 24A and the second refractive element 24B of the imaging optical assembly 24 are directed at the beam splitter 26. In this embodiment, if the beam splitter 26 is a fifty percent (50%) beam splitter, the transmitted rays 16T or the reflected rays 16R can be split into (i) the imaged rays 16I that are imaged on the image sensor 28, and (ii) discarded rays that are directed away from the image sensor 28.

It should be further appreciated that when the spectral imaging device 12 is being utilized in transmission mode, the illumination switch 22 can further activate a splitter mover 26M that moves the beam splitter 26 out of the way (out of the beam path) of the transmitted rays 16T, as the beam splitter 26 is not necessary for directing the illumination beam 16 toward the sample 10 (such as is required in the reflection mode in this embodiment).

In various embodiments, the image sensor 28 can include a two-dimensional array of sensors that are used to construct a two-dimensional image including the two dimensional array of data (data at each pixel). Additionally, the design of the image sensor 28 can be varied to correspond to the optical frequency range of the illumination beam 16, i.e. of the imaged rays 16I. For example, for a MIR beam 16, the image sensor 28 can be an infrared camera that includes an image sensor that senses infrared light and converts the infrared light into an array of electronic signals that represents an image of the sample. Stated in another fashion, if the illumination beam 16 is in the MIR range, the image sensor 28 can be a MIR imager. More specifically, if the illumination beam 16 is in the infrared spectral region from two to twenty μm, the image sensor 28 is sensitive to the infrared spectral region from two to twenty μm.

Non-exclusive examples of suitable infrared image sensors 28 include (i) vanadium oxide ($VO_x$) and amorphous silicon microbolometer arrays such as the FPA in the FLIR Tau 640 infrared camera that are typically responsive in the seven to fourteen μm spectral range; (ii) mercury cadmium telluride (HgCdTe or MCT) arrays such as those in the FLIR Orion SC7000 Series cameras that are responsive in the 7.7 to 11.5 μm spectral range; (iii) indium antimonide (InSb) arrays such as those in the FLIR Orion SC7000 Series cameras that are responsive in the 1.5 to 5.5 μm spectral range; (iv) indium gallium arsenide (InGaAs); (v) uncooled hybrid arrays involving $VO_x$ and other materials from DRS that are responsive in the two to twenty μm spectral range; or (vi) any other type of image sensor that is designed to be sensitive to infrared light in the two to twenty μm range and has electronics allowing reading out of each element's signal level to generate a two-dimensional array of image information (data).

In one specific embodiment, the image sensor 28 is a microbolometer that includes a two-dimensional array of photosensitive elements (pixels) that are sensitive to the optical frequency of the illumination beam 16. Stated in another fashion, in one embodiment, the image sensor 28 is a micro-electromechanical systems (MEMS) device fabricated in such a way as to create a plurality of small bolometer pixel elements that is thermally isolated from the underlying substrate. The spacing between the pixel elements is referred to as the pitch of the array. As non-exclusive examples, the two-dimensional array can include approximately 640×480; 320×240; 480×480; 80×60; 1080×720; 120×120; 240×240; or 480×640 pixels. It should be noted that the information from the pixels can be used to generate the output images 13A, 13B, 13C and/or the spectral cube 13.

During use of the spectral imaging device 12, it is desired to improve the spectral resolution and quality of the two-dimensional data of images of the sample 10 and the spectral cube. More specifically, in various applications, it is desired to inhibit various noise sources from adversely impacting the quality of the two-dimensional data of the images 13A, 13B, 13C of the sample 10 that are being generated. Stated in another manner, in such applications, it is desired to improve the signal-to-noise ratio (SNR) of the ratioed images of the sample 10.

Unfortunately, in real systems, various random and systematic noise sources may exist which can cause a diminished and/or undesired SNR. Examples of random noise sources include, but are not limited to, quantum (Shot) and thermal (Johnson) noise in the image sensor 28, amplitude and frequency fluctuations of the illumination source, and random fluctuations in the transmittance of components contained within the spectral imaging device 12. Examples of systematic noise sources include, but are not limited to, the drift in illumination intensity, frequency, and the directional pointing of the source between trials.

An additional wavelength-dependent noise source in spectroscopic imaging systems can arise as a result from multiple reflections from surfaces and edges of the refractive elements within the spectral imaging device 12. For spectral imaging devices 12 which employ temporally coherent optical sources 14 such as a laser or optically filtered broad band sources, the complex electric fields of the multiple reflected beams will add coherently to produce an optical frequency dependent transmittance as a result of constructive and destructive interference.

Figure 2:
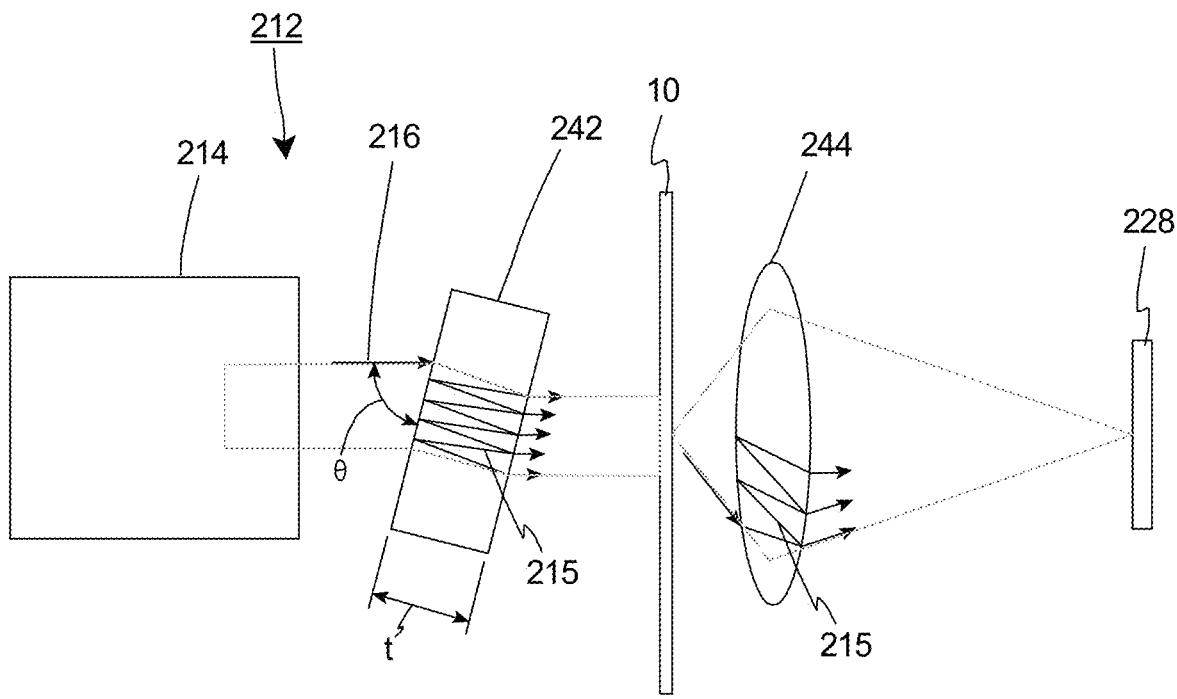
FIG. 2 is a simplified schematic illustration of a spectral imaging device.

FIG. 2 is an illustration of a simplified spectral imaging device 212 that facilitates the discussion of examples of situations where such multiple reflections can adversely impact the quality of the images (not shown in FIG. 2) being generated of the sample 10 with an image sensor 228. More particularly, FIG. 2 is a simplified schematic illustration of reflections 215 being generated when an illumination beam 216 from an optical source 214 is transmitted through refractive elements. One example is that of a transparent window 242 having a physical thickness of "t" along the beam path and two surfaces each having a small but finite reflectance, R. Typically these surfaces are coated with anti-reflection coatings which are designed to minimize the magnitude of reflectance for all optical frequencies contained within the instrument measurement band. However, it is difficult in practice to achieve surface reflectivity values that are sufficiently low across the entire tuning range of the optical source without increasing the cost of the system substantially and therefore some amount of reflectivity must be tolerated. As a result of the small but finite residual reflectivity of the component surfaces, multiple reflections will add up on the image plane of the image sensing device 228 to produce an optical frequency-dependent intensity modulation. In this case, the window 242, e.g. refractive element, acts as a parasitic Fabry-Perot etalon (FPE).

In another example, refractive elements such as lenses 244 having curved surfaces and finite thicknesses and separation distances between elements, may also act as sources of multiple reflections 215 and as a consequence produce undesired optical frequency dependent intensity modulation. Though the exact optical frequency-dependent intensity modulation characteristic for lenses 244 differs from that of the Fabry-Perot etalon, the general principle of the Fabry-Perot etalon captures the essence of the physical principles.

It should be appreciated that the examples illustrated in FIG. 2 are non-exclusive, and that reflections can occur as a result of any of the refractive elements in the path of the illumination beam 16 including air gap spacings between refractive elements.

For the embodiment illustrated in FIG. 2, the transmittance of an etalon depends on the optical frequency (or wavelength) of the illumination beam 216, the index of refraction of the material (n) of the refractive element 242, the angle of incidence (θ) of the illumination beam 216 on the refractive element 242, the surface reflectance (R) of the refractive element 242, and the physical thickness (t) of refractive element 242 along the beam path. Since the thickness and index of refraction are temperature dependent, the transmittance therefore also depends on the ambient temperature.

The optical frequency dependence of a Fabry-Perot etalon can be described using the Airy function as follows:

$$T = \frac{T_{max}}{1 + F \cdot \sin^2(\delta/2)}. \qquad \text{Equation (1)}$$

In Equation (1) and elsewhere, (i) T is the transmittance; (ii) $T_{max}$ is maximum transmittance; (iii) F is Finesse; and (iv) δ is the Airy function argument. $T_{max}$ can be calculated as provided below:

$$T_{max} = \left(1 - \frac{A}{1-R}\right)^2. \qquad \text{Equation (2)}$$

In Equation (2) and elsewhere, (i) A is the absorbance of the refractive element and (ii) R is the surface reflectance.

The Finesse, F can be calculated as follows:

$$F = \frac{4R}{(1-R)^2}. \qquad \text{Equation (3)}$$

Further, the Airy function argument δ can be calculated as follows:

$$\delta = 2\beta. \qquad \text{Equation (4)}$$

In Equation (4) and elsewhere, β is a parameter that can be calculated as follows:

$$\beta = \frac{2\pi}{\lambda} \Lambda \cos(\theta). \qquad \text{Equation (5)}$$

In Equation (5) and elsewhere, λ is the optical frequency of the illumination beam, and Λ is the optical thickness of the refractive element. The optical thickness Λ and can be calculated as follows:

$$\Lambda = n \cdot t. \qquad \text{Equation (6)}$$

In Equation (6) and elsewhere, n is the index of refraction of the refractive element and t is the physical thickness of the refractive element. Thus, the optical thickness of the material, Λ, (optical path length through element) is calculated by the product of the index of refraction, n, and the physical thickness of the transparent material, t of the refractive element.

Further, an optical frequency period of modulation $\Delta v_{mod}$ of the transmittance function can be expressed in units of wavenumbers (cm$^{-1}$) as follows:

$$\Delta v_{mod} = \frac{1}{2\Lambda}. \qquad \text{Equation (7)}$$

Thus, the modulation of the transmittance is periodic in optical frequency space and is given by the reciprocal of twice the optical thickness of the material, Λ. Further, the strength of the modulation depends on the reflectivity R of the surfaces and in the range of small values of R (<5%), the peak-to-peak modulation is approximately four times that of the value of surface reflectance. Therefore, for a refractive element, e.g. window, having a reflectance of 2.5%, the peak-to-peak modulation will be approximately 10% and would limit the SNR to about 10:1. As an approximation, the modulation of a refractive element can be estimated by treating it as a Fabry-Perot etalon with an equivalent thickness (t) given by its center thickness.

Figure 3:
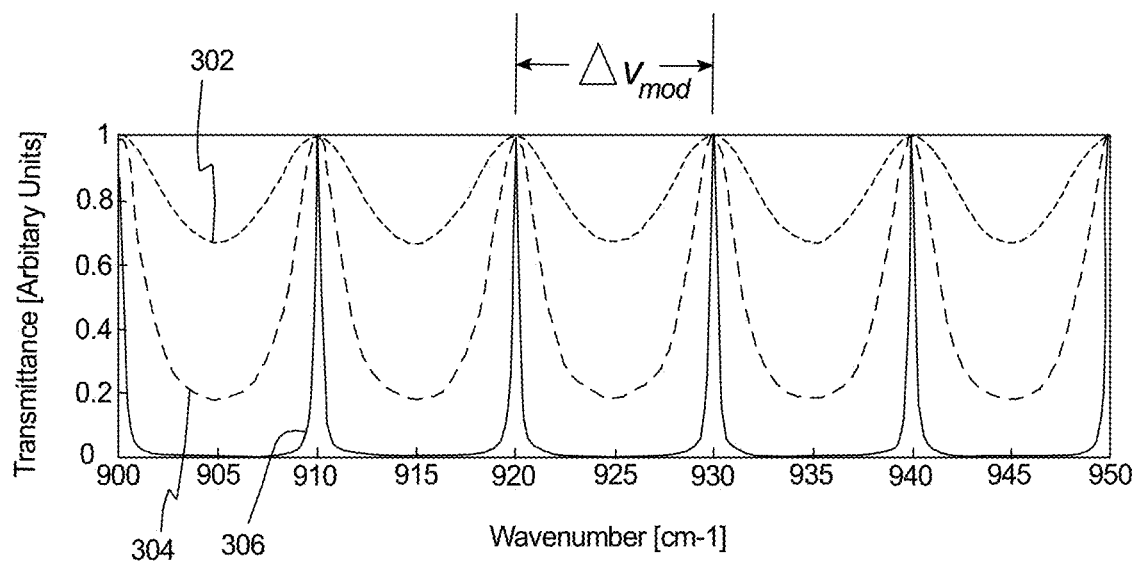
FIG. 3 is a simplified graph that illustrates transmittance versus wavenumber for a refractive element having two surfaces with varying degree of surface reflectances.

FIG. 3 is a simplified graph that illustrates transmittance versus wavenumber for refractive elements having three alternative reflectances, R. Curve 302 (short dashed line) plots the transmittance versus wavenumber for a refractive element having a reflectance of 0.1 (R=0.1); Curve 304 (long dashed line) plots the transmittance versus wavenumber for a refractive element having a reflectance of 0.4 (R=0.4); and Curve 306 (solid line) plots the transmittance versus wavenumber for a refractive element having a reflectance of 0.9 (R=0.9).

In FIG. 3, the optical frequency period of the modulation of the transmittance $\Delta v_{mod}$ is equal to ten cm$^{-1}$ wavenumbers. However, the amount of change in the transmittance varies significantly based on the reflectivity R.

As provided herein, if the background normalization is not performed, the transmittance modulation associated with this refractive element will directly corrupt the spectral data SNR and produce undesirable artifacts in the images. One way to mitigate this effect is to ratio the spectral cube with a background spectral cube. This approach is effective if the optical frequency dependent component modulation and the source optical frequency are highly repeatable from run-to-run. However, in practice, the optical thickness of the parasitic etalons of the system will vary by a small amount due to changes in the environmental temperature, pressure, or stress of the system so as to cause small but significant changes in the transmittance function whose exact dependence on time may not be known a priori. Also, the optical frequency of the coherent light source may vary from run-to-run because of stochastic laser dynamics or imperfections in the tuning mechanisms. These small differences in either the source optical frequency or the parasitic etalon modulation function will result in changes in the transmittance value and therefore limit the SNR of the ratioed images captured by the system. Therefore, further techniques are required to improve the SNR of the system.

Figure 4A:
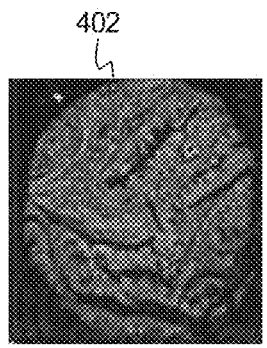
FIG. 4A is a simplified illustration of an ideal image a sample.
Figure 4B:
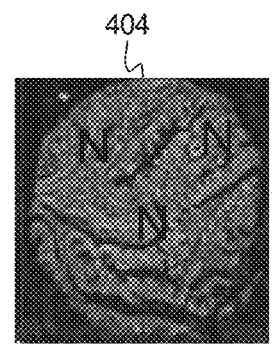
FIG. 4B is a simplified illustration of a first non-ideal image of the sample.

FIG. 4A illustrates an ideal image 402 of the sample that would be captured by the image sensor if all of the noise is eliminated from the spectral imaging device. However, each refractive element will create noise in the captured image. As provided herein, for a given material, reflectance and optical frequency, a thicker refractive element produces a high-Fourier space frequency spectral artifact in the image cube, whereas a thinner refractive element produces a low-Fourier space frequency spectral artifact in the image. FIG. 4B illustrates a first non-ideal image 404 (the image from FIG. 4A plus "N's" that represent noise) of the sample that would be captured by the image sensor if a thin refractive element is in the optical path. FIG. 4B illustrates the concept that if the thin element is used in the system, the resulting first non-ideal image 404 will be somewhat equivalent to the ideal image 402 plus the spectral noise introduced as a result of the thin refractive element (thin parasitic etalon).

Figure 4C:
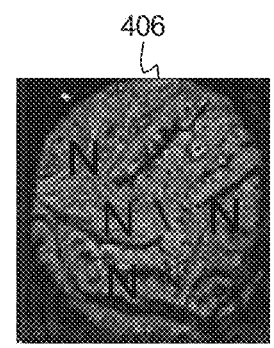
FIG. 4C is a simplified illustration of a second non-ideal image of the sample.

FIG. 4C illustrates a second non-ideal image 406 (the image from FIG. 4A plus "N's" that represent noise) of the sample that would be captured by the image sensor if a thick refractive element is in the optical path. FIG. 4C illustrates the concept that if the thick element is used in the system, the resulting second non-ideal image 406 will be somewhat equivalent to the ideal image 402 plus the spectral noise introduced as a result of the thick refractive element (thick parasitic etalon).

Figure 5A:
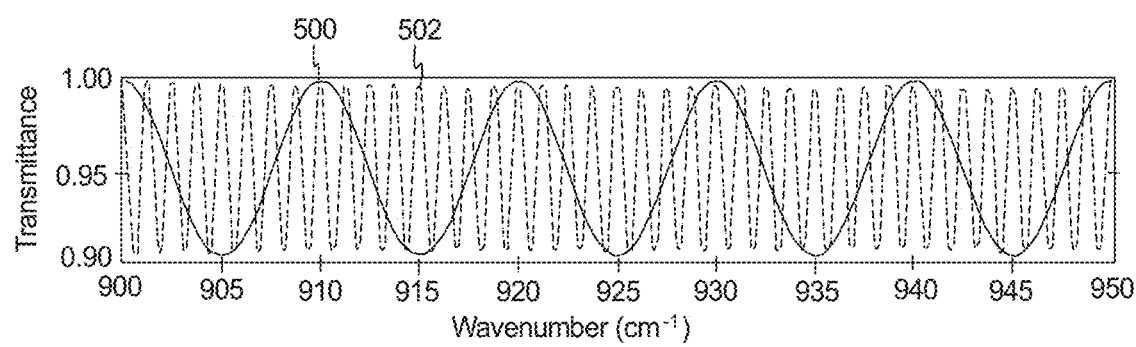
FIG. 5A is a graph of transmittance versus wavenumber in the optical frequency space for two different thickness of refractive elements.

FIG. 5A is a graph of transmittance versus wavenumber in the optical frequency space, that includes a first curve 500 (solid line) that illustrates the transmittance modulation of a refractive element having an optical thickness of 0.5 millimeters ($\Lambda$=0.5 mm.), and a second curve 502 (short dashes) that illustrates the transmittance modulation of a refractive element having an optical thickness of 4 millimeters ($\Lambda$=4 mm.). In this example, the reflectivity (2.5%) and material are the same for both refractive elements. The only difference is the optical thickness. Comparing curve 500 to curve 502, in the optical frequency space, the transmittance modulation has a longer period between maxima for the thinner element than for the thicker element.

Figure 5B:
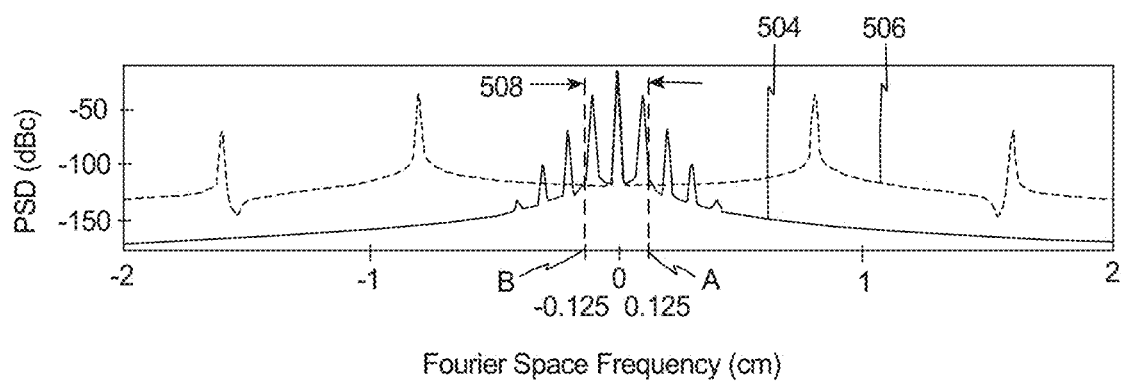
FIG. 5B is a graph that illustrates the power spectral density versus Fourier space frequency in the Fourier Space of the two refractive elements shown in FIG. 5A.

A useful way to analyze the effects of the parasitic etalon caused by the refractive elements (e.g. lens and other elements in the optical path) of the spectral imaging device is to examine the optical frequency modulation function in the reciprocal Fourier frequency space having units of inverse wavenumber of centimeter (cm). This can be accomplished by applying a Fourier transform to the modulation transfer function of the etalon from FIG. 5A. More specifically, FIG. 5B is a graph that illustrates the Fourier space power spectral density ("PSD") versus Fourier space frequency in the Fourier Space, that includes a first curve 504 (solid line) that illustrates the transmittance modulation of the refractive element having the optical thickness of 0.5 millimeters ($\Lambda$=0.5 mm.), and a second curve 506 (short dashes) that illustrates the transmittance modulation of the refractive element having an optical thickness of 4 millimeters ($\Lambda$=4 mm.). Again, in this example, the reflectivity (2.5%) and material are the same for both refractive elements. The only difference is the optical thickness.

Comparing curve 504 to curve 506, in the Fourier space frequency, the transmittance modulation of the thinner refractive element is concentrated near zero centimeters, and transmittance modulation of the thicker refractive element is spread out along the Fourier space and not concentrated near zero centimeters. Further, when the refractive element is optically thinner (0.5 mm versus 4 mm), the Fourier frequency space components of the parasitic etalon are lower.

As provided above, the spectral imaging device 12 includes a Fourier space measurement pass band 508 (also referred to as the "pass band") which is the reciprocal of the desired spectral resolution. In one embodiment, the upper limit A, and lower limit B, of the pass band 508 are given by A=1/(2$\Delta$v), and B=−1/(2$\Delta$v), where $\Delta$v, is the desired spectral resolution that the spectral imaging device is designed to achieve. For example, in this non-exclusive example, the desired spectral resolution is 4 cm$^{-1}$ ($\Delta$v=4 cm$^{-1}$). The Fourier measurement pass band for this non-exclusive embodiment would therefore have an upper limit A, and the lower limit B of the pass band 508 in Fourier space 0.125 cm (2 cm$^{-1}$) and −0.125 cm (−2 cm$^{-1}$), respectively.

As illustrated in FIG. 5B, the Fourier space representation of the modulation shows that the thinner etalon produces non-dc components within a typical measurement pass band of 0.25 cm.

With reference to both FIGS. 5A and 5B, the thinner refractive element ($\Lambda$=0.5 mm) has Fourier components (curve 504) that fall squarely within the pass band 508, whereas many of the Fourier components (curve 506) of the thicker refractive element ($\Lambda$=4 mm) fall outside of the pass band 508.

Figure 6A:
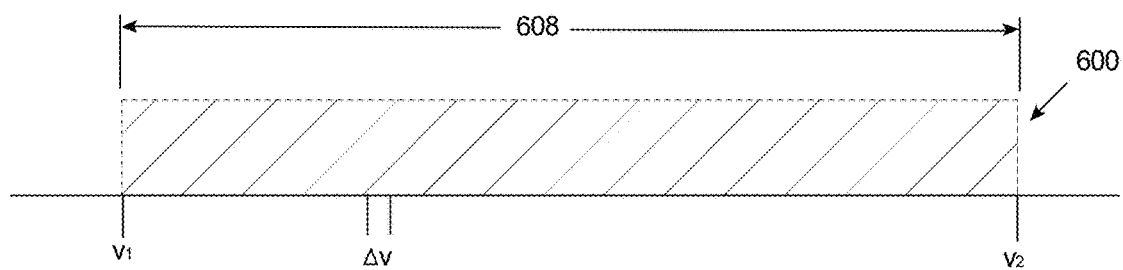
FIG. 6A is a simplified illustration of the optical frequency space for an spectral imaging device.

FIG. 6A is a simplified illustration of the optical frequency space 600 for an spectral imaging device. FIG. 6A also illustrates the spectral measurement range 607, the desired spectral resolution $\Delta$v; the lower bound of the spectral band $v_1$; and the upper bound of the spectral band, $v_2$.

Figure 6B:
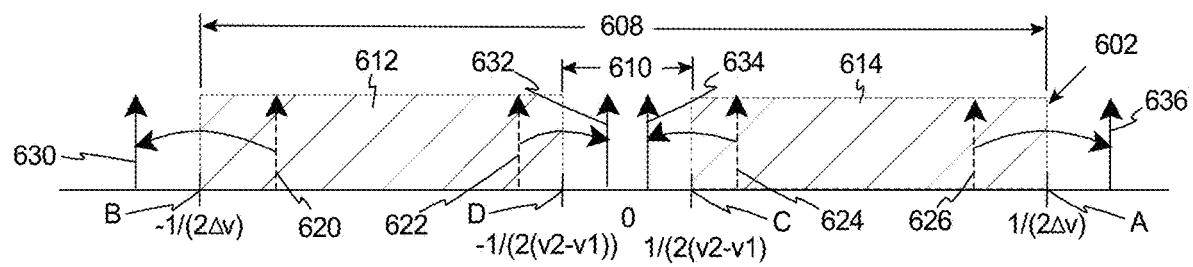
FIG. 6B is a simplified illustration of the corresponding Fourier space for the spectral imaging device.

FIG. 6B is a simplified illustration of the corresponding Fourier space 602 for the spectral imaging device, including the pass band 608. As provided herein, the pass band 608 includes a gap 610 in the pass band 608 that exists near the origin of Fourier space 602 due to the finite optical frequency range of the spectral imaging system. Because of the gap 610, the pass band 608 includes a negative Fourier space partition 612 and a positive Fourier space partition 614 that are spaced apart and separated by the gap 610.

This gap 610 has upper limit C, determined with equation C=1/(2($v_2$−$v_1$)) and a lower limit D, determined with equation D=−1/(2($v_2$−$v_1$)), where $v_2$ and $v_1$ are the upper and lower bounds of the optical frequency range covered by the spectroscopic imaging system. Further, as provided above, the upper limit A, and lower limit B, of the pass band 508 are given by A=1/(266 v), and B=−1/(2$\Delta$v).

In one, non-exclusive embodiment, for an IR imaging system covering the 900-1800 cm$^{-1}$ spectral range and having a spectral resolution of 4 cm$^{-1}$, the pass band will have the following four values: A=1.25 mm; B=−0.125 mm; C=+5.55 um; and D=−5.5 um.

As provided herein, the architecture of the spectral imaging device can be adjusted and designed so that parasitic etalon modulation Fourier space components fall outside of the negative Fourier space partition 612 and the positive Fourier space partition 614 of the measurement pass band 608. This can be accomplished by designing and positioning the refractive elements in the spectral imaging device so that the optical thickness of parasitic etalons are outside the negative Fourier space partition 612 and the positive Fourier space partition 614.

FIG. 6B illustrates a non-optimized design that includes (i) a Fourier space component of a first parasitic etalon component 620 (illustrated with a dashed arrow); (ii) a Fourier space component of a second parasitic etalon component 622 (illustrated with a dashed arrow); (iii) a Fourier space component of a third parasitic etalon component 624 (illustrated with a dashed arrow); and (iv) a Fourier space component of a fourth parasitic etalon component 626 (illustrated with a dashed arrow). In this non-optimized design, (i) the first and second etalon components 620, 622 are in the negative Fourier space partition 612 of the pass band 608; and (ii) the third and fourth etalon components 624, 626 are in the positive Fourier space partition 614 of the pass band 608.

As provided herein, the architecture of the spectral imaging device can be adjusted and designed to move the (i) the first and second etalon components 620, 622 out of the negative Fourier space partition 612 of the pass band 608; and (ii) the third and fourth etalon components 624, 626 out of the positive Fourier space partition 614 of the pass band 608. More specifically, the architecture of the spectral imaging device can be adjusted to shift and move (i) the first etalon component 620 out the negative Fourier space partition 612 of the pass band 608 as illustrated by solid arrow 630; (ii) the second etalon component 622 out the negative Fourier space partition 612 of the pass band 608 as illustrated by solid arrow 632 into the gap 610; (iii) the third etalon component 624 out the positive Fourier space partition 614 of the pass band 608 as illustrated by solid arrow 634 into the gap 610; and (iv) the fourth etalon component 626 out the positive Fourier space partition 614 of the pass band 608 as illustrated by solid arrow 636.

Stated in another fashion, the architecture of the refractive elements of the spectral imaging device are (i) sufficiently thick to move the Fourier space components of the first and fourth parasitic etalon components 620, 626 higher than the pass band upper and lower limits; or (ii) sufficiently thin so as to push the Fourier space components of the second and third parasitic etalon components 622, 624 between the positive and negative pass band regions. In FIG. 6B, the dashed arrows 620, 622, 614, 626 illustrate parasitic etalon components prior to shifting, while the solid line arrows illustrate parasitic etalon components 630, 632, 634, 634 after shifting.

Thus, in certain embodiments, by properly designing the system, parasitic etalon components 620, 622, 624, 626 are shifted out of the operating pass band by forcing optical path length of parasitic etalons to be greater than ½Δv. A non-exclusive example, of typical parameter values for a mid-infrared spectroscopic imaging system are Δv=4 cm$^{-1}$, v1=900 cm$^{-1}$, v2=1800 cm$^{-1}$. In this example, in Fourier space, these parameters create a positive and negative pass band range of +5.56 to +1250 μm and −5.56 to −1250 μm respectively.

Returning back to FIG. 1B, as noted above, FIG. 1B is a simplified schematic illustration of a transmission beam path 50 of the illumination beam 16 from the optical source 14 of the spectral imaging microscope 12, with the sample 10 being interrogated via transmission of the illumination beam 16 through the sample 10. In particular, FIG. 1B illustrates the various components of the spectral imaging microscope 12 that are utilized when the sample 10 is being interrogated in transmission mode. It should be appreciated that the additional components of the spectral imaging microscope 12 that are only utilized when the sample 10 is being interrogated in reflection mode have been omitted from FIG. 1B for purposes of clarity and ease of description.

As illustrated in FIG. 1B, when being utilized in transmission mode, the components of the spectral imaging microscope 12 include the optical source 14 which generates and/or emits the illumination beam 16, the transmission beam steerer 20T, the image sensor 28, and various optical elements, e.g., refractive elements, including such refractive elements that make up the transmission illumination optical assembly 18T and the imaging optical assembly 24. As utilized herein, such optical elements, including the refractive elements that make up the transmission illumination optical assembly 18T and the imaging optical assembly 24, can be referred to generally as a "transmission optical assembly".

More specifically, as shown, the transmission optical assembly can include (i) a first refractive element 46A, e.g., a window; (ii) a second refractive element 46B, e.g., a refractive lens; (iii) a third refractive element 46C, e.g., a window; (iv) a fourth refractive element 46D, e.g., including the sample 10 and/or any slide that can be utilized for the sample 10; (v) a fifth refractive element 46E, e.g., the first refractive lens 24A of the imaging optical assembly 24; (vi) a sixth refractive element 46F, e.g., the second refractive lens 24B of the imaging optical assembly 24; and (vii) a seventh refractive element 46G, e.g., a window positioned near to and/or in front of the image sensor 28. Moreover, each of the refractive elements 46A-46G are spaced apart from one another, as well as being spaced apart from the optical source 14 and the transmission beam steerer 20T.

As illustrated in this embodiment, when being used in transmission mode, the transmission beam path 50 of the illumination beam 16 follows from the optical source 14 to the first refractive element 46A, to the second refractive element 46B, to the transmission beam steerer 20T, to the third refractive element 46C, to the fourth refractive element 46D (including the sample 10), to the fifth refractive element 46E, to the sixth refractive element 46F, to the seventh refractive element 46G, and finally to the image sensor 28.

Additionally, as provided herein, the thickness of each of the refractive elements 46A-46G, as well as the spacing (also referred to herein as a "separation distance") between each of the components is specifically designed such that Fourier space components of the transmittance function for each of the refractive elements 46A-46G and each of the separation distances fall outside the measurement pass band. For example, (i) the first refractive element 46A has a first element optical thickness, $t_1$; (ii) the second refractive element 46B has a second element optical thickness, $t_2$; (iii) the third refractive element 46C has a third element optical thickness, $t_3$; (iv) the fourth refractive element 46D has a fourth element optical thickness, $t_4$; (v) the fifth refractive element 46E has a fifth element optical thickness, $t_5$; (vi) the sixth refractive element 46F has a sixth element optical thickness, $t_6$; and (vii) the seventh refractive element 46G has a seventh element optical thickness, $t_7$, which are each designed to have a Fourier space component of the transmittance function that falls outside the measurement pass band.

Further, (i) a first separation distance, $d_1$, between the optical source 14 and the first refractive element 46A; (ii) a second separation distance, $d_2$, between the first refractive element 46A and the second refractive element 46B; (iii) a third separation distance, $d_3$, between the second refractive element 46B and the transmission beam steerer 20T; (iv) a fourth separation distance, $d_4$, between the transmission beam steerer 20T and the third refractive element 46C; (v) a fifth separation distance, $d_5$, between the third refractive element 46C and the fourth refractive element 46D; (vi) a sixth separation distance, $d_6$, between the fourth refractive element 46D and the fifth refractive element 46E; (vii) a seventh separation distance, $d_7$, between the fifth refractive element 46E and the sixth refractive element 46F; and (viii) an eighth separation distance, $d_8$, between the sixth refractive element 46F and the seventh refractive element 46G, are also each designed to have a Fourier space component of the transmittance function that falls outside the measurement pass band.

Additionally, as noted above, FIG. 1C is a simplified schematic illustration of a reflection beam path 52 of the illumination beam 16 from the optical source 14 of the spectral imaging microscope 12, with the sample 10 being interrogated via reflection of the illumination beam 16 off of the sample 10. In particular, FIG. 1C illustrates the various components of the spectral imaging microscope 12 that are utilized when the sample 10 is being interrogated in reflection mode. It should be appreciated that the additional components of the spectral imaging microscope 12 that are only utilized when the sample 10 is being interrogated in transmission mode have been omitted from FIG. 1C for purposes of clarity and ease of description.

As illustrated in FIG. 1C, when being utilized in reflection mode, the components of the spectral imaging microscope 12 include the optical source 14 which generates and/or emits the illumination beam 16, the reflection beam steerers 20R1, 20R2, the image sensor 28, and various optical elements, e.g., refractive elements, including the beam splitter 26 and such refractive elements that make up the reflection illumination optical assembly 18R and the imaging optical assembly 24. As utilized herein, such optical elements, including the beam splitter 26 and the refractive elements that make up the reflection illumination optical assembly 18R and the imaging optical assembly 24, can be referred to generally as a "reflection optical assembly".

More specifically, as shown, the reflection optical assembly can include (i) the first refractive element 46A, e.g., a window; (ii) an eighth refractive element 46H, e.g., a refractive lens; (iii) a ninth refractive element 46I, e.g., the beam splitter 26; (iv) the fourth refractive element 46D, e.g., including the sample 10 and/or any slide that can be utilized for the sample 10; (v) the fifth refractive element 46E, e.g., the first refractive lens 24A of the imaging optical assembly 24; (vi) the sixth refractive element 46F, e.g., the second refractive lens 24B of the imaging optical assembly 24; and (vii) the seventh refractive element 46G, e.g., a window positioned near to and/or in front of the image sensor 28. Moreover, each of the refractive elements 46A, 46D-46I are spaced apart from one another, as well as being spaced apart from the optical source 14 and the reflection beam steerers 20R1, 20R2.

As illustrated in this embodiment, when being used in reflection mode, the reflection beam path 52 of the illumination beam 16 follows from the optical source 14 to the first refractive element 46A, to the first reflection beam steerer 20R1, to the second reflection beam steerer 20R2, to the eighth refractive element 46H, to the ninth refractive element 46I (the beam steerer 26), to the sixth refractive element 46F, to the fifth refractive element 46E, to the fourth refractive element 46D (including the sample 10), back to the fifth refractive element 46E, to the sixth refractive element 46F, to the ninth refractive element 46I (the beam splitter 26), to the seventh refractive element 46G, and finally to the image sensor 28.

Additionally, as provided herein, the thickness of each of the refractive elements 46A, 46D-46I, as well as the spacing (i.e. the "separation distance") between each of the components is specifically designed such that Fourier space components of the transmittance function for each of the refractive elements 46A, 46D-46I and each of the separation distances fall outside the measurement pass band. For example, (i) the first refractive element 46A has the first element optical thickness, $t_1$; (ii) the fourth refractive element 46D has the fourth element optical thickness, $t_4$; (iii) the fifth refractive element 46E has the fifth element optical thickness, $t_5$; (iv) the sixth refractive element 46F has the sixth element optical thickness, $t_6$; (v) the seventh refractive element 46G has the seventh element optical thickness, $t_7$; (vi) the eighth refractive element 46H has an eighth element optical thickness, $t_8$; and (iii) the ninth refractive element 46I has a ninth element optical thickness, $t_9$, which are each designed to have a Fourier space component of the transmittance function that falls outside the measurement pass band.

Further, (i) the first separation distance, $d_1$, between the optical source 14 and the first refractive element 46A; (ii) a ninth separation distance, $d_9$, between the first refractive element 46A and the first reflection beam steerer 20R1; (iii) a tenth separation distance, $d_{10}$, between the first reflection beam steerer 20R1 and the second reflection beam steerer 20R2; (iv) an eleventh separation distance, $d_{11}$, between second reflection beam steerer 20R2 and the eighth refractive element 46H; (v) a twelfth separation distance, $d_{12}$, between the eighth refractive element 46H and the ninth refractive element 46I; (vi) the sixth separation distance, $d_6$, between the fourth refractive element 46D and the fifth refractive element 46E; (vii) the seventh separation distance, $d_7$, between the fifth refractive element 46E and the sixth refractive element 46F; and (viii) a thirteenth separation distance, $d_{13}$, between the ninth refractive element 46I and the seventh refractive element 46G, are also each designed to have a Fourier space component of the transmittance function that falls outside the measurement pass band.

Additionally, as provided herein, in certain embodiments, the position (i.e. spacing) of the components and the design (i.e. thickness) of the various components in the spectral imaging device 12 can be adjusted and designed to insure that parasitic etalon modulation occurs outside of the pass band.

Table 1, shown below, provides one, non-exclusive example, of possible element-to-element separation distances ("$d_1$" through "$d_{14}$") and element optical thicknesses ("$t_1$" through "$t_9$") which meet design criteria for the spectral imaging microscope 12. It should be noted that the numbers in Table 1 are based on the spectral imaging microscope 12 being designed to provide a 4 cm$^{-1}$ spectral resolution in each of the embodiments, i.e. in each of the transmission mode and the reflection mode. Additionally, it should be noted that the separation distances and element optical thicknesses may need to be different than those specifically provided in Table 1 to desirably manage the parasitic etalon components, if the design and characteristics of the spectral imaging microscope 12 are changed.

TABLE 1

| Distance/Thickness Parameter | Minimum Design Criteria | Optimum Design Criteria | Typical range of values in practice |
|---|---|---|---|
| $d_1$ | >1.25 mm | >10 mm | 1.25-500 mm |
| $d_2$ | >1.25 mm | >10 mm | 1.25-500 mm |
| $d_3$ | >1.25 mm | >10 mm | 1.25-500 mm |
| $d_4$ | >1.25 mm | >10 mm | 1.25-500 mm |
| $d_5$ | >1.25 mm | >10 mm | 1.25-500 mm |
| $d_6$ | >1.25 mm | >10 mm | 1.25-500 mm |
| $d_7$ | >1.25 mm | >10 mm | 1.25-500 mm |
| $d_8$ | >1.25 mm | >10 mm | 1.25-500 mm |
| $d_9$ | >1.25 mm | >10 mm | 1.25-500 mm |
| $d_{10}$ | >1.25 mm | >10 mm | 1.25-500 mm |
| $d_{11}$ | >1.25 mm | >10 mm | 1.25-500 mm |

TABLE 1-continued

| Distance/<br>Thickness<br>Parameter | Minimum<br>Design<br>Criteria | Optimum<br>Design<br>Criteria | Typical range<br>of values in<br>practice |
| --- | --- | --- | --- |
| $d_{12}$ | >1.25 mm | >10 mm | 1.25-500 mm |
| $d_{13}$ | >1.25 mm | >10 mm | 1.25-500 mm |
| $d_{14}$ | >1.25 mm | >10 mm | 1.25-500 mm |
| $t_1$ | >(1.25 mm)/n | >(10 mm)/n | 1-5 mm (n = 1.3-4.3) |
| $t_2$ | >(1.25 mm)/n | >(10 mm)/n | 1-5 mm (n = 1.3-4.3) |
| $t_3$ | >(1.25 mm)/n | >(10 mm)/n | 1-5 mm (n = 1.3-4.3) |
| $T_4$ | >(1.25 mm)/n | >(10 mm)/n | 1-5 mm (n = 1.3-4.3) |
| $t_5$ | >(1.25 mm)/n | >(10 mm)/n | 1-5 mm (n = 1.3-4.3) |
| $t_6$ | >(1.25 mm)/n | >(10 mm)/n | 1-5 mm (n = 1.3-4.3) |
| $t_7$ | >(1.25 mm)/n | >(10 mm)/n | 1-5 mm (n = 1.3-4.3) |
| $t_8$ | >(1.25 mm)/n | >(10 mm)/n | 1-5 mm (n = 1.3-4.3) |
| $t_9$ | >(1.25 mm)/n | >(10 mm)/n | 1-5 mm (n = 1.3-4.3) |

Additionally, as provided herein, the influence of parasitic etalon components can be reduced and managed in other unique ways. For example, with reference to FIG. 1A, as provided above, the spectral imaging device 12 can be controlled to generate a separate output image 13A, 13B, 13C at a plurality of distinct target optical frequencies. With this design, each target optical frequency includes a corresponding output image 13A, 13B, 13C. Subsequently, the control system 30 uses the output images 13A, 13B, 13C to generate the spectral cube 13.

Because the noise is optical frequency dependent, as provided herein, for each target optical frequency, the spectral imaging device 12 can capture a plurality of preliminary images at optical frequencies near or equal to the target optical frequency. Subsequently, for each target optical frequency, the corresponding plurality of preliminary images can be used to generate a corresponding output image having reduced noise for that target optical frequency.

Figure 7A:
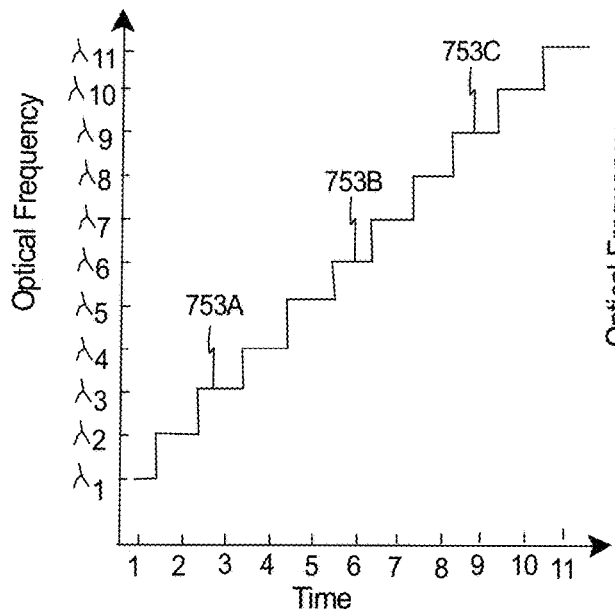
FIG. 7A is a graph that illustrates optical frequency versus time.
Figure 7B:
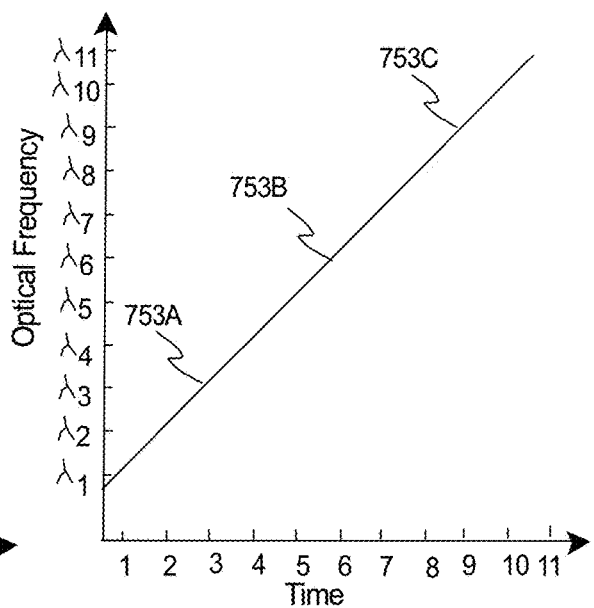
FIG. 7B is another graph that illustrates optical frequency versus time.

FIG. 7A is a graph that illustrates optical frequency versus time. As provided herein, the control system 30 (illustrated in FIG. 1A) can control the tunable optical source 14 (illustrated in FIG. 1A) to generate an illumination beam 16 (illustrated in FIG. 1A) having a center optical frequency that changes in a stepped pattern from a first optical frequency to an eleventh optical frequency over time. Somewhat similarly, FIG. 7B is a graph that illustrates optical frequency versus time. In this example, the control system 30 (illustrated in FIG. 1A) controls the tunable optical source 14 (illustrated in FIG. 1A) to generate an illumination beam 16 (illustrated in FIG. 1A) having a center optical frequency that changes in a linear fashion from a first optical frequency to an eleventh optical frequency over time. It should be noted that the optical frequency can be adjusted in another fashion than illustrated in FIGS. 7A and 7B.

In these examples, the first through eleventh optical frequencies are each within the desired tuning range of the spectral imaging device 12 (illustrated in FIG. 1A). Further, in these simplified examples, (i) at time one the illumination beam 16 has a center optical frequency of one; (ii) at time two the illumination beam 16 has a center optical frequency of two; (iii) at time three the illumination beam 16 has a center optical frequency of three; (iv) at time four the illumination beam 16 has a center optical frequency of four; (v) at time five the illumination beam 16 has a center optical frequency of five; (vi) at time six the illumination beam 16 has a center optical frequency of six; (vii) at time seven the illumination beam 16 has a center optical frequency of seven; (viii) at time eight the illumination beam 16 has a center optical frequency of eight; (ix) at time nine the illumination beam 16 has a center optical frequency of nine; (x) at time ten the illumination beam 16 has a center optical frequency of ten; and (xi) at time eleven the illumination beam 16 has a center optical frequency of eleven.

It should be noted that one or more of the optical frequencies can be a target optical frequency 753A, 753B, 753C. In this non-exclusive example, optical frequencies three, six and nine are target optical frequencies 753A, 753B, 753C.

Figure 7C:
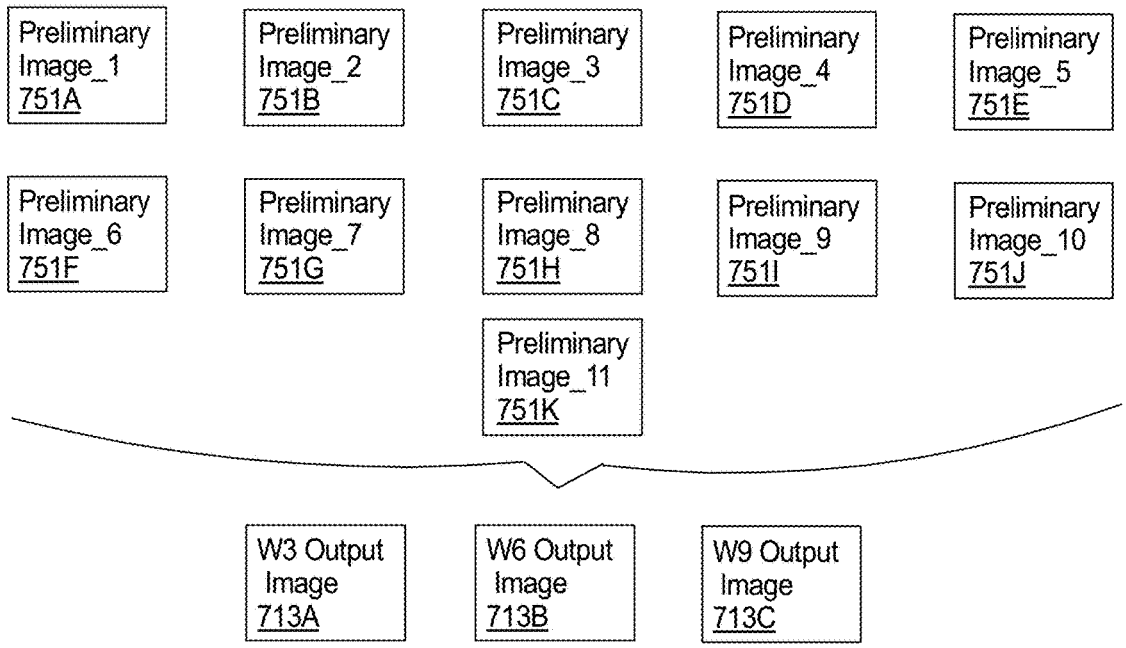
FIG. 7C illustrates a plurality of preliminary images used to generate a separate output image for each target optical frequency.

FIG. 7C illustrates a plurality of preliminary images 751A, 751B, 751C, 751D, 751E, 751F, 751G, 752H, 751I, 751J, 751K that can be used to generate a separate output image 713A, 713B, 713C for each target optical frequency 753A, 753B, 753C (illustrated in FIGS. 7A and 7B).

In this simplified example, with reference to FIGS. 7A-7C, the spectral imaging device 12 (illustrated in FIG. 1A) is controlled to (i) capture a first preliminary ("sampling") image 751A while illuminating the sample 10 (illustrated in FIG. 1A) with the illumination beam 16 (illustrated in FIG. 1A) having the first center optical frequency (at time=1); (ii) capture a second preliminary image 751B while illuminating the sample 10 with the illumination beam 16 having the second center optical frequency (at time=2); (iii) capture a third preliminary image 751C while illuminating the sample 10 with the illumination beam 16 having the third center optical frequency (at time=3); (iv) capture a fourth preliminary image 751D while illuminating the sample 10 with the illumination beam 16 having the fourth center optical frequency (at time=4); (v) capture a fifth preliminary image 751E while illuminating the sample 10 with the illumination beam 16 having the fifth center optical frequency (at time=5); (vi) capture a sixth preliminary image 751F while illuminating the sample 10 with the illumination beam 16 having the sixth center optical frequency (at time=6); (vii) capture a seventh preliminary image 751G while illuminating the sample 10 with the illumination beam 16 having the seventh center optical frequency (at time=7); (viii) capture an eighth preliminary image 751H while illuminating the sample 10 with the illumination beam 16 having the eighth center optical frequency (at time=8); (ix) capture a ninth preliminary image 751I while illuminating the sample 10 with the illumination beam 16 having the ninth center optical frequency (at time=9); (x) capture a tenth preliminary image 751J while illuminating the sample 10 with the illumination beam 16 having the tenth center optical frequency (at time=10); and (xi) capture an eleventh preliminary image 751K while illuminating the sample 10 with the illumination beam 16 having the eleventh center optical frequency (at time=11).

Subsequently, the spectral imaging device 12 uses one or more of the preliminary ("sampling") images 751A-751K to generate the separate target output image 713A, 713B, 713C for each target optical frequency 753A, 753B, 753C. The number of preliminary images 751A-751K used to generate the separate output images 713A, 713B, 713C can vary. As non-exclusive examples, 2, 3, 4, 5, 6, 7 or 8 preliminary images 751A-751K can be used to generate each of the output images 713A, 713B, 713C. Typically, the preliminary images 751A-751K utilized are captured near or at the target optical frequency.

In one example, if five preliminary images 751A-751K are used, (i) the first through fifth preliminary images 751A-751E are used to generate the output image 713A for target optical frequency 753A at optical frequency three; (ii) the fourth through eighth preliminary images 751D-751H are used to generate the output image 713B for target optical frequency 753B at optical frequency six; and (iii) the seventh through eleventh preliminary images 751G-751K are used to generate the output image 713C for target optical frequency 753C at optical frequency nine.

The method used to combine the multiple preliminary images to generate the respective output images can vary. In one, non-exclusive embodiment, the corresponding multiple preliminary images are passed through a low-pass filter to generate the respective output image. Stated in another fashion, a low-pass filter is subsequently applied to the spectral response of each pixel in the respective preliminary images to create an output spectral image at a lower spectral resolution with less noise. In this example, (i) the first through fifth preliminary images 751A-751E are passed through a low-pass filter to generate the output image 713A for target optical frequency 753A at optical frequency three; (ii) the fourth through eighth preliminary images 751D-751H are passed through a low-pass filter to generate the output image 713B for target optical frequency 753B at optical frequency six; and (iii) the seventh through eleventh preliminary images 751G-751K are passed through a low-pass filter to generate the output image 713C for target optical frequency 753C at optical frequency nine.

As non-exclusive examples, the low-pass filter can utilize either a running average or Gaussian filter, and optionally followed by sub-sampling through decimation. One such method is to perform a simple average of the collected data points. Another method is to perform a simple average of the data points after the extreme values are removed from the data set. Extreme values may be defined, for example, as those falling outside of a predefined multiple of the root-mean-square of the collection. Another method is to pass a low-pass filter over the data set, such as a Chebyshev filter. The low-pass filter may be applied in optical frequency space or in Fourier frequency space and may be performed before or after any ratio taken between a data collection and background data collection.

It should be noted that a sampling optical frequency sampling period (or inverse of the optical frequency sampling rate) between each of the first through eleventh optical frequencies in which preliminary images are captured can be varied pursuant to the teachings provided herein. In certain embodiments, the optical frequency step size is the reciprocal of the sampling rate. In one embodiment, the optical frequency step size is sufficiently small such that it does not produce aliasing of the Fourier frequency components of the optical frequency dependent transmittance function of the parasitic etalons contained along the beam path into the measurement pass band. For example, the optical frequency step size should be less than or equal to the free spectral range (FSR) of the refractive element in the spectral imaging device 12 having the shortest free spectral range of a refractive element in the beam path divided by two.

Stated in another fashion, in certain embodiments, for this method to be effective, the sampling rate must be sufficiently high, and the sampling period, $\Delta v_{sampling}$, sufficiently small, so as to inhibit aliasing of the spurious spectral signal into the measurement pass band. As used herein, the term "sampling rate" shall mean the inverse of the optical frequency sampling period, and the term "sampling period" shall mean optical frequency sampling period $\Delta v_{sampling}$. Aliasing may cause the Fourier frequency components of the spurious spectral signals to shift from outside of the pass band to into the measurement pass band. In such a case, removal of the spurious signals by filtering can be achieved, but at the expense of sacrificing spectral resolution of the system, which is undesired. As non-exclusive examples, the optical frequency sampling period can be approximately within the range 0.1-10 cm$^{-1}$, and specific values of 0.1, 0.25, 0.33, 0.5, 0.67, 0.7, 1.0, 1.5, 2.0, 2.5, 3.33, 5.0, and 10 cm$^{-1}$.

As provided herein, the parasitic etalons have Fourier components which repeat at integer multiples of their free-spectral-range (FSR), and is given by ½ nL in units of wavenumbers. In order to ensure that each spurious component falls outside of the pass band, the measurement samples should be collected at interval optical spacing, $\Delta v_{sampling}$, which are at least as small as half the FSR associated with the parasitic etalon. The FSR should also be smaller than the minimum spectral resolution, $\Delta v$, of the system in order that the spectral resolution is not compromised by the filtering of the spurious signal.

$$\Delta v_{sampling} \leq FSR/2 \leq \Delta v. \qquad \text{Equation (8)}$$

Stated in yet another fashion, the control system 30 controls the tunable light source 14 to generate a set of discrete sampling optical frequencies near a target optical frequency, with adjacent sampling optical frequencies of the set being spaced apart a sampling optical frequency step, and the sampling optical frequency step being sufficiently small such that it does not produce aliasing of the Fourier components of the optical frequency dependent transmittance function of the parasitic etalons contained along the beam path into the measurement pass band. Further, the control system controls the image sensor to capture or construct a separate, two dimensional sampling image at each discrete sampling optical frequency, and the control system constructs a target output image of the sample for the target optical frequency using the separate two dimensional sampling images at each discrete sampling optical frequency.

As provided herein, the term "sampling optical frequency step" shall mean the smallest allowed difference between adjacent sampling optical frequencies. In alternative, non-exclusive embodiments, the sampling optical frequency step can be approximately 0.1, 0.2, 0.25, 0.33, 0.5, 0.67, 0.7, 1.0, 2.0, 4.0, 8.0, or 16, wavenumbers. In this example, the target optical frequency step (difference between target optical frequencies) is larger than the sampling optical frequency step.

In summary, as provided herein, the influence of parasitic etalon components can be reduced and managed by discrete sampling, filtering, and decimation. First, a plurality of preliminary ("sampling") images are captured. Subsequently, the preliminary images are filtered to create a lower spectral resolution image that can optionally be sub-sampled (e.g. via decimation) to remove the redundant information from now being oversampled. Thus, a collection of spectral images is captured at multiple discrete optical frequencies in the neighborhood of the desired measurement frequency. This collection of data points is then mathematically filtered so as to produce a single higher-fidelity data point.

Figure 8A:
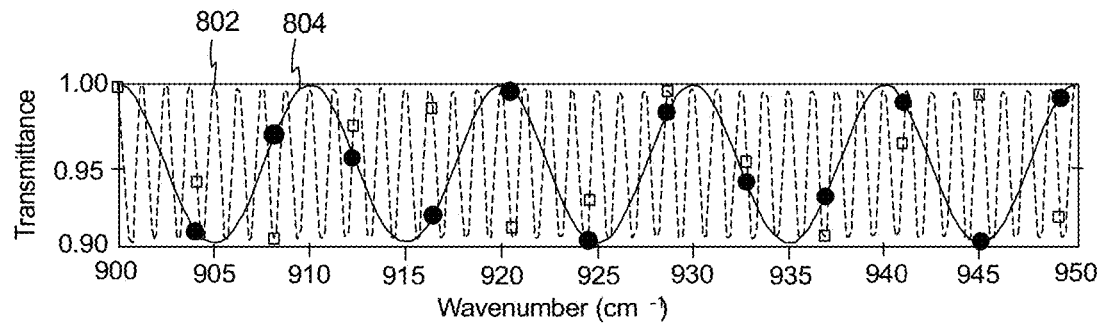
FIG. 8A is a graph of transmittance versus wavenumber in the optical frequency space for two different refractive elements having different thickness with solid circles and open squares showing sampled data points.
Figure 8B:
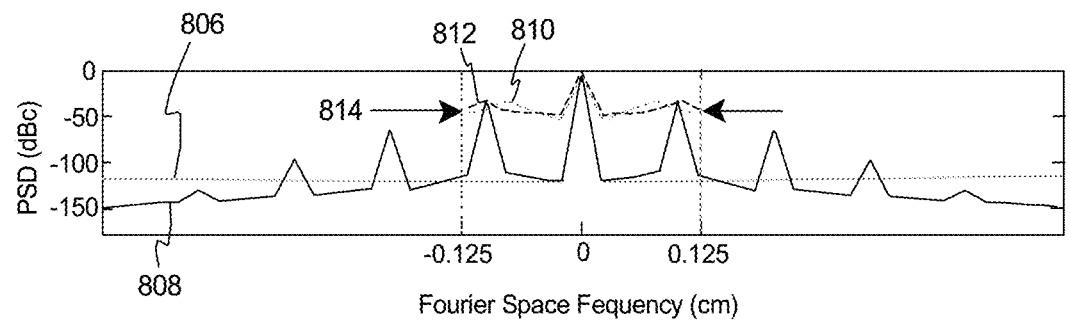
FIG. 8B is a graph in the Fourier frequency space of the sampled transmittance versus wavenumber plots shown in FIG. 8A.

FIGS. 8A and 8B are useful for the further discussion of the method of filtering the coherent noise caused by a parasitic etalon by means of discrete sampling, filtering, and subsequent decimation. The optical frequency sampling period is set by the prescription and is chosen to be sufficiently fine, so as not to introduce spectral leakage due to aliasing into the measurement pass band.

More specifically, FIG. 8A is a graph of transmittance versus wavenumber in the optical frequency space that illustrates (i) the modulation 802 (illustrated with a dashed line) of the first parasitic etalon components for a first refractive element having a first thickness (e.g. t=4 mm), and (ii) the modulation 804 (illustrated with a solid line) of the second parasitic etalon components for a second refractive element having a second thickness (e.g. t=0.5 mm) which is less than the first thickness. In this example, the first element has an optical path that is longer than the second element. The graph in FIG. 8A includes (i) circles that represent discrete samplings of the first parasitic etalon components 1012 sampled at 4.1 cm$^{-1}$, and (ii) solid dots that represent discrete samplings of the of the second etalon components. As a non-exclusive example, the sampling intervals are 4.1 cm$^{-1}$.

FIG. 8B is a graph in the Fourier space frequency that illustrates (i) the modulation 806 (illustrated with a solid gray line) of the first parasitic etalon components of the first refractive element (e.g. t=4 mm), and (ii) the modulation 808 (illustrated with a solid black line) of the second parasitic etalon components of the second optical element (e.g. t=0.5 mm). The graph of FIG. 8B also includes (i) discrete samplings 810 (illustrated with a gray dashed line) of the first parasitic etalon components sampled at 4.1 cm$^{-1}$, and (ii) discrete sampling 812 (illustrated with a black dashed line) of the second etalon components sampled at 4.1 cm$^{-1}$.

A pass band 814 (e.g. a 0.250 cm passband) is also illustrated in FIG. 8B. It should be noted that insufficient sampling at 4.1 cm$^{-1}$ of the first refractive element (t=4 mm) can cause Fourier components of the first parasitic etalon components to leak into the pass band 814.

Figure 9:
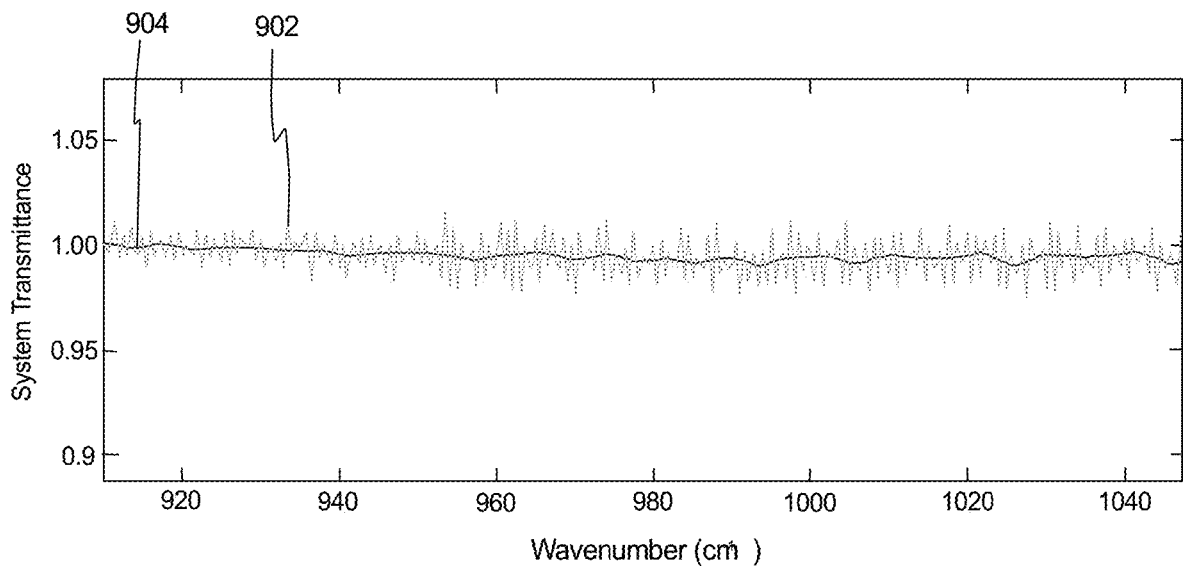
FIG. 9 is a graph in the optical frequency space of a sampled raw signal data and a sampled, averaged, and decimated signal data.

FIG. 9 is a graph in the optical frequency space of a sampled raw signal data 902 (illustrated with a gray line) and a sampled and filtered signal data 904 (illustrated with a black line). As can be seen from FIG. 9, the variation in signal data 902 cause by the parasitic etalon components is greatly reduced by sampling, filtering, and subsequent decimation as seen by line 904. Thus, as provided herein, coherent noise produced by a parasitic etalon can be filtered by means of discrete sampling and filtering.

In yet another embodiment, as provided herein, a reduction in spurious spectral artifacts in the output image can also be achieved through fast source frequency modulation and real-time detector averaging. Stated in another fashion, a reduction in noise can be achieved by rapidly tuning the optical source 14 to generate an illumination beam 16 having a rapidly varying center optical frequency or optical frequency near a target optical frequency (optical frequency), and slowly capturing the output image with the image sensor 28 during the optical frequency (optical frequency) variation. With this design, for each target optical frequency (optical frequency), the spectral imaging device 12 can dither the optical frequency (optical frequency) of the illumination beam during the capture of the respective output image.

Figure 10A:
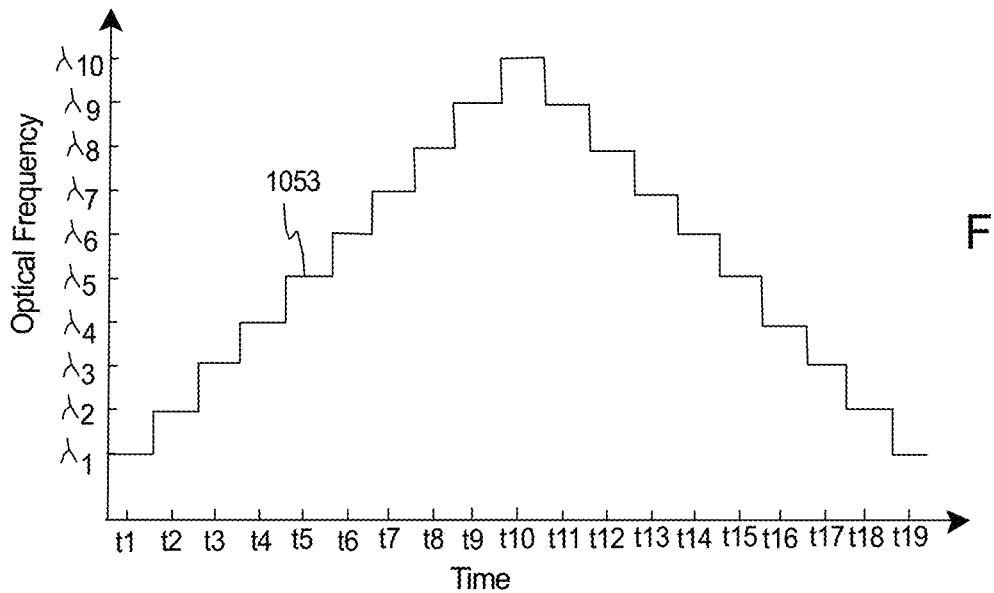
FIG. 10A is a graph that illustrates optical frequency versus time.
Figure 10B:
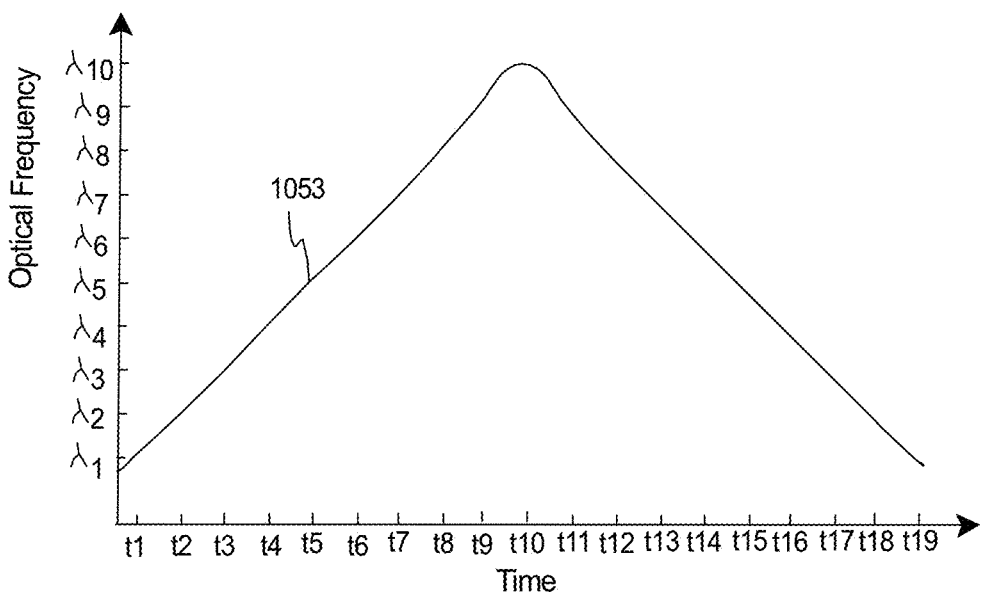
FIG. 10B is a another graph that illustrates optical frequency versus time.

FIG. 10A is a graph that illustrates optical frequency versus time. As provided herein, the control system 30 (illustrated in FIG. 1A) can control the tunable optical source 14 (illustrated in FIG. 1A) to generate an illumination beam 16 (illustrated in FIG. 1A) having a center optical frequency that changes in a stepped pattern from a first optical frequency to a tenth optical frequency and back to the first optical frequency over time. Somewhat similarly, FIG. 10B is a graph that illustrates optical frequency versus time. In this example, the control system 30 (illustrated in FIG. 1A) controls the tunable optical source 14 (illustrated in FIG. 1A) to generate an illumination beam 16 (illustrated in FIG. 1A) having a center optical frequency that changes in a linear fashion from the first optical frequency to the tenth optical frequency and back to the first optical frequency over time. It should be noted that the optical frequency can be adjusted in another fashion than illustrated in FIGS. 10A and 10B.

In these examples, the first through tenth optical frequencies are each within the desired tuning range of the spectral imaging device 12 (illustrated in FIG. 1A). Further, in these simplified examples, (i) at time one the illumination beam 16 has a center optical frequency of one; (ii) at time two the illumination beam 16 has a center optical frequency of two; (iii) at time three the illumination beam 16 has a center optical frequency of three; (iv) at time four the illumination beam 16 has a center optical frequency of four; (v) at time five the illumination beam 16 has a center optical frequency of five; (vi) at time six the illumination beam 16 has a center optical frequency of six; (vii) at time seven the illumination beam 16 has a center optical frequency of seven; (viii) at time eight the illumination beam 16 has a center optical frequency of eight; (ix) at time nine the illumination beam 16 has a center optical frequency of nine; (x) at time ten the illumination beam 16 has a center optical frequency of ten; (xi) at time eleven the illumination beam 16 has a center optical frequency of nine; (xii) at time twelve the illumination beam 16 has a center optical frequency of eight; (xiii) at time thirteen the illumination beam 16 has a center optical frequency of seven; (xiv) at time fourteen the illumination beam 16 has a center optical frequency of six; (xv) at time fifteen the illumination beam 16 has a center optical frequency of five; (xvi) at time sixteen the illumination beam 16 has a center optical frequency of four; (xvii) at time seventeen the illumination beam 16 has a center optical frequency of three; (xviii) at time eighteen the illumination beam 16 has a center optical frequency of two; and (xiv) at time nineteen the illumination beam 16 has a center optical frequency of one.

It should be noted that one or more of the optical frequencies can be a target optical frequency 1053. In this non-exclusive example, optical frequency five is the target optical frequency 1053.

Figure 10C:
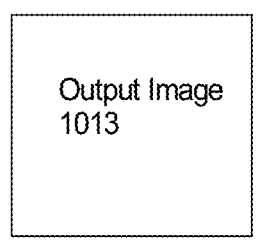
FIG. 10C illustrates an output image.

FIG. 10C illustrates an output image 1013 that is captured while the illumination beam 16 (illustrated in FIG. 1A) is cycled from the first through tenth optical frequency (first half of the cycle) and back from the tenth optical frequency to the first optical frequency (second half of the cycle). In this simplified example, with reference to FIGS. 10A-10C, the spectral imaging device 12 (illustrated in FIG. 1A) is controlled to capture the output image 1013 for the target optical frequency 1053 of optical frequency five while the center optical frequency of the illumination beam 16 is varied (dithered) cycled twice between one and ten optical frequencies. Alternatively, the tunable optical source 14 can be controlled to dither the optical frequency only one cycle or more than two cycles during the capturing of the output image 1013. As non-exclusive examples, the number of cycles can be approximately 1, 2, 3, 4, 5, 10, 20, 40, 50, 100, or more cycles (but the desired number of cycles is more than 10) during a capture time of the image by the image sensor.

In certain embodiments, the control system 30 (illustrated in FIG. 1A) modulates the tunable light source 14 (illustrated in FIG. 1A) to generate a set of discrete modulation optical frequencies near a target optical frequency to produce a maximum optical frequency modulation, $\Delta v_{modulation}$, about the target optical frequency set point which satisfies the following prescription: $\Delta v_{modulation} = \pm \eta \Delta v/2$, where $\eta$ is a constant having a value of greater than or equal to 0.1 and less than or equal to 100, and $\Delta v$ is the desired spectral resolution. Further, in this embodiment, the image sensor 28 (illustrated in FIG. 1A) captures the output image during a capture time that is greater than the frequency modulation.

As a non-exclusive examples, the amount of dithering about the target optical frequency of the modulation optical frequencies during the capture time can be approximately plus or minus 0.1, 0.25, 0.33, 0.5, 1, 2, 3, 4, 5, 6, 7, 10, or more wavenumbers.

In summary, the control system can modulate the tunable light source to generate a set of discrete modulation optical frequencies about and through a target optical frequency with an optical frequency modulation rate, and the image sensor can be controlled to capture the target output image during a capture time that is longer than the inverse of the optical frequency modulation rate.

Figure 11:
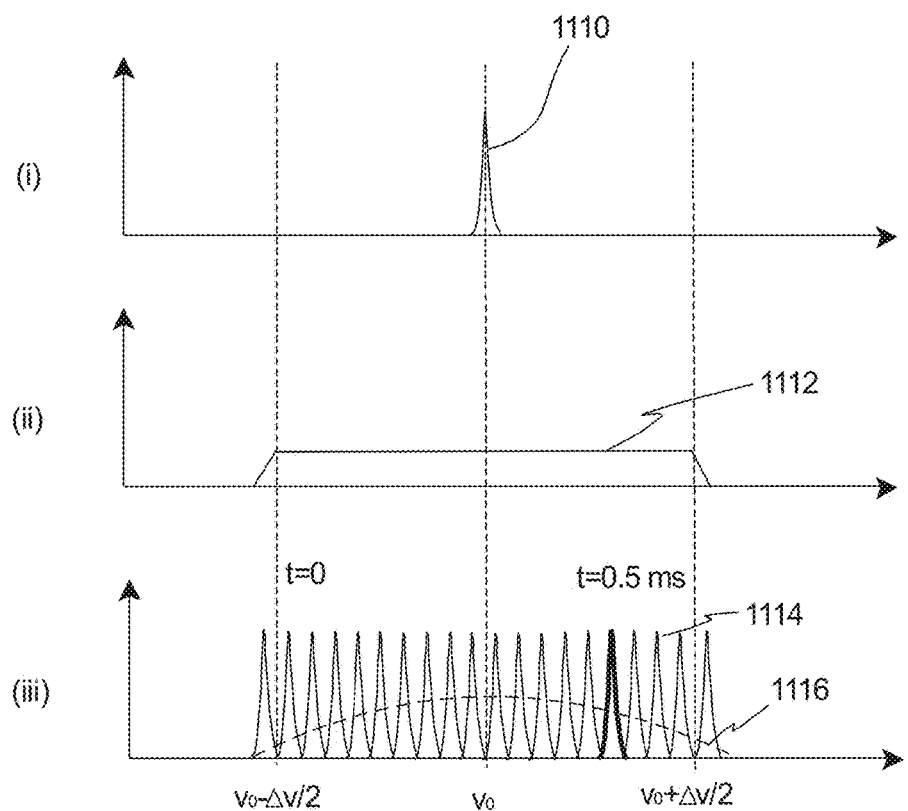
FIG. 11 includes an upper graph with an illustration of a narrow optical frequency distribution, a middle graph with an illustration of a very broad optical frequency distribution of an output beam, and a lower graph having a schematic illustration of a plurality of narrow optical frequency pulses of energy generated in a relatively short period of time and the dashed line showing the time-averaged optical frequency of the series of pulses.

FIG. 11 includes (i) an upper graph 1110 having a schematic illustration of a narrow optical frequency distribution (line with narrower than the interference that we are trying to ignore) of a typical laser output beam; (ii) a middle graph 1112 having a schematic illustration of a very broad optical frequency distribution of an output beam (an ideally broadened laser line to be approximate a top hat); and (iii) a lower graph 1114 having a schematic illustration of a plurality of narrow optical frequency pulses of energy generated in a relatively short period of time (a laser line whose center value is shifted over time in time to produce a desired time-averaged optical frequency distribution which fills the spectral band $\Delta v$). Thus, provided herein, the output of the laser source can be extrinsically broadened using dynamic optical frequency modulation of laser line (dithering the laser) to produce the desired, time-averaged optical frequency distribution 1116 (dashed line).

Thus, as provided herein, the modulation of the parasitic etalons can be filtered by fast optical frequency modulation of the laser source and real-time detector averaging. This has an effect of averaging out the parasitic etalons and improving the resulting image quality and spectral fidelity. This embodiment has a distinct advantage in live video discrete frequency imaging with coherent illumination since it is becomes unnecessary to acquire multiple frames at different optical frequencies and the implementation of digital signal processing to remove the noise. In many instances, the features of interest are broader than a narrow line width. Additionally, the parasitic etalons can be finer than the features of interest. Thus, it can be advantageous to average the unwanted spectral noise that manifests itself as a fringe pattern in the spatial domain by using a broad optical frequency (e.g. modulate optical frequency over time). This can be done with either a CW laser or a pulsed laser.

Figure 12A:
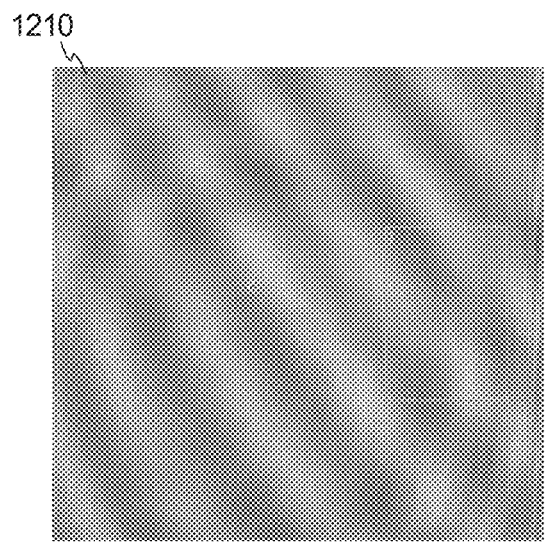
FIG. 12A is an image captured without noise reduction methods provided herein.

FIG. 12A is an image 1210 captured without noise reduction methods provided herein. It should be noted that this image 1210 includes a plurality of fringes that adversely influence the quality of the image 1210.

Figure 12B:
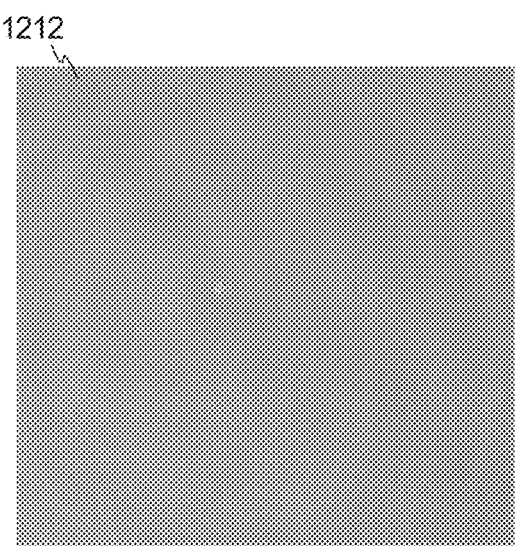
FIG. 12B is a captured image using the spectral image device provided herein.

FIG. 12B is a captured image 1212 using the spectral image device 12 provided herein. The image 1212 of FIG. 12B is less influenced by the fringes.

It is understood that although a number of different embodiments of an spectral imaging device 12 have been illustrated and described herein, one or more features of any one embodiment can be combined with one or more features of one or more of the other embodiments, provided that such combination satisfies the intent of the present invention.

While the particular spectral imaging device 12 as herein shown and disclosed in detail is fully capable of obtaining the objects and providing the advantages herein before stated, it is to be understood that it is merely illustrative of some of the presently preferred embodiments of the invention and that no limitations are intended to the details of construction or design herein shown other than as described in the appended claims.

What is claimed is:

1. A spectral imaging device for generating one or more, two-dimensional, images of a sample including a first image, the spectral imaging device comprising:
    a tunable light source that directs an illumination beam at the sample;
    an image sensor that includes a two-dimensional array of sensors that capture information;
    an imaging optical assembly that collects light from the sample and forms an optical image on the image sensor; and
    a control system including a processor that (i) controls the image sensor to capture a first preliminary image while controlling the tunable light source so that the illumination beam has a first center optical frequency; (ii) controls the image sensor to capture a second preliminary image while controlling the tunable light source so that the illumination beam has a second center optical frequency that is different than the first center optical frequency, wherein the first center optical frequency and the second center optical frequency are spaced apart a sampling optical frequency step, and the sampling optical frequency step is sized to not produce aliasing of Fourier components of an optical frequency dependent transmittance function of parasitic etalons contained along the beam path into the measurement pass band; and (iii) generates a first output image using the first preliminary image and the second preliminary image.

2. The spectral imaging device of claim 1 wherein the first preliminary image and the second preliminary image are passed through a low-pass filter to generate the first output image.

3. The spectral imaging device of claim 2 wherein the control system applies the low-pass filter utilizing a running average.

4. The spectral imaging device of claim 2 wherein the control system applies the low-pass filter utilizing a Gaussian filter.

5. The spectral imaging device of claim 2 wherein the control system applies the low-pass filter utilizing at least one of a running average and a Gaussian filter, and additionally sub-samples the data.

6. The spectral imaging device of claim 1 wherein the tunable light source emits a temporally coherent illumination beam and a desired tuning range is the mid-infrared range; and wherein the imaging optical assembly includes at least one refractive element that is operable in the mid-infrared range.

7. The spectral imaging device of claim 1 wherein the control system that (i) controls the image sensor to capture a third preliminary image while controlling the tunable light source so that the illumination beam has a third center optical frequency that is different than the first center optical frequency and the second center optical frequency; and (ii) generates the first output image using the first preliminary image, the second preliminary image, and the third preliminary image.

8. The spectral imaging device of claim 7 wherein the control system that (i) controls the image sensor to capture a fourth preliminary image while controlling the tunable light source so that the illumination beam has a fourth center optical frequency that is different than the first center optical frequency, the second center optical frequency, and the third optical frequency; and (ii) generates the first output image using the first preliminary image, the second preliminary image, the third preliminary image, and the fourth preliminary image.

9. The spectral imaging device of claim 1 wherein the control system that (i) controls the image sensor to capture a third preliminary image while controlling the tunable light source so that the illumination beam has a third center optical frequency that is different than the first center optical frequency and the second center optical frequency; (ii) controls the image sensor to capture a fourth preliminary image while controlling the tunable light source so that the illumination beam has a fourth center optical frequency that is different than the first center optical frequency, the second center optical frequency, and the third center optical frequency; and (iii) generates a second output image using the third preliminary image and the fourth preliminary image.

10. The spectral imaging device of claim 1 wherein the tunable light source is a tunable mid-infrared laser and each optical frequency is in the mid-infrared range.

11. A method for spectrally analyzing a sample comprising:
    directing an illumination beam at the sample with a tunable light source;
    providing an image sensor that includes a two-dimensional array of sensors that capture information;
    collecting light from the sample and forming an optical image on the image sensor with an imaging optical assembly;
    controlling the image sensor to capture a first preliminary image while the light source is tuned so that the illumination beam has a first center optical frequency;
    controlling the image sensor to capture a second preliminary image while the light source is tuned so that the illumination beam has a second center optical frequency that is different than the first center optical frequency, wherein the first center optical frequency and the second center optical frequency are spaced apart a sampling optical frequency step, and the sampling optical frequency step is sized to not produce aliasing of Fourier components of an optical frequency dependent transmittance function of parasitic etalons contained along the beam path into the measurement pass band; and
    generating a first output image using the first preliminary image and the second preliminary image.

12. The method of claim 11 wherein generating a first output image includes passing the first preliminary image and the second preliminary image through a low-pass filter.

13. The method of claim 11 wherein generating a first output image includes passing the first preliminary image and the second preliminary image through a low-pass filter utilizing at least one of a running average and a Gaussian filter, and additionally sub-sampling the data.

14. The method of claim 11 further comprising controlling the image sensor to capture a third preliminary image while the light source is tuned so that the illumination beam has a third center optical frequency that is different than the first center optical frequency and the second center optical frequency; and wherein generating the first output image includes using the first preliminary image, the second preliminary image, and the third preliminary image.

15. The method of claim 14 further comprising controlling the image sensor to capture a fourth preliminary image while the light source is tuned so that the illumination beam has a fourth center optical frequency that is different than the first center optical frequency, the second center optical frequency, and the third center optical frequency; and wherein generating the first output image includes using the first preliminary image, the second preliminary image, the third preliminary image, and the fourth preliminary image.

16. The method of claim 11 further comprising (i) controlling the image sensor to capture a third preliminary image while the light source is tuned so that the illumination beam has a third center optical frequency that is different than the first center optical frequency and the second center optical frequency; (ii) controlling the image sensor to capture a fourth preliminary image while the light source is tuned so that the illumination beam has a fourth center optical frequency that is different than the first center optical frequency, the second center optical frequency, and the third center optical frequency; and (iii) generating a second output image using the third preliminary image and the fourth preliminary image.

17. The method of claim 11 wherein the directing the illumination beam include the light source being a tunable mid-infrared laser and each optical frequency is in the mid-infrared range.

18. A spectral imaging device for generating one or more, two-dimensional, images of a sample including a first image, the spectral imaging device comprising:
    an image sensor that includes a two-dimensional array of sensors that capture information used to construct the two-dimensional spectral images;
    a tunable light source that generates an illumination beam that follows a beam path from the tunable light source to the sample and from the sample to the image sensor;
    an optical assembly including a plurality of refractive elements that are positioned along the beam path between the tunable light source and the image sensor; and
    a control system including a processor that (i) controls the image sensor to capture a first preliminary image while controlling the tunable light source so that the illumination beam has a first center optical frequency; (ii) controls the image sensor to capture a second preliminary image while controlling the tunable light source so that the illumination beam has a second center optical frequency that is different than the first center optical frequency, wherein the first center optical frequency and the second center optical frequency are spaced apart a sampling optical frequency step, and the sampling optical frequency step is sized to not produce aliasing of Fourier components of an optical frequency dependent transmittance function of parasitic etalons contained along the beam path into the measurement pass band; and (iii) uses the first preliminary image and the second preliminary image to generate a first output image.

19. The spectral imaging device of claim 18 wherein the first preliminary image and the second preliminary image are passed through a low-pass filter to generate the first output image.

* * * * *